United States Patent
Yamazaki et al.

(10) Patent No.: US 7,932,589 B2
(45) Date of Patent: Apr. 26, 2011

(54) SEMICONDUCTOR DEVICE AND METHOD FOR MANUFACTURING THE SAME

(75) Inventors: Shunpei Yamazaki, Tokyo (JP); Jun Koyama, Kanagawa (JP); Kiyoshi Kato, Kanagawa (JP); Takaaki Koen, Hakusan (JP); Yuto Yakubo, Kanagawa (JP); Makoto Yanagisawa, Kanagawa (JP); Hisashi Ohtani, Tochigi (JP); Eiji Sugiyama, Ichinomiya (JP); Nozomi Horikoshi, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 451 days.

(21) Appl. No.: 12/219,382

(22) Filed: Jul. 21, 2008

(65) Prior Publication Data
US 2009/0085182 A1    Apr. 2, 2009

(30) Foreign Application Priority Data

Jul. 27, 2007    (JP) ................................. 2007-195497

(51) Int. Cl.
*H01L 23/06*    (2006.01)

(52) U.S. Cl. ................. 257/684; 438/125; 257/E23.063; 257/E21.053

(58) Field of Classification Search .................. 257/678, 257/679, 684, 790, E21.053, E23.063, E23.064, 257/E23.065; 438/112, 125
See application file for complete search history.

(56) References Cited

U.S. PATENT DOCUMENTS

| | | | |
|---|---|---|---|
| 5,075,166 A | 12/1991 | Sikorski et al. | |
| 5,597,631 A | 1/1997 | Furumoto et al. | |
| 5,757,456 A | 5/1998 | Yamazaki et al. | |
| 5,770,313 A | 6/1998 | Furumoto et al. | |
| 5,821,138 A | 10/1998 | Yamazaki et al. | |
| 6,072,345 A | 6/2000 | Ooishi | |
| 6,118,502 A | 9/2000 | Yamazaki et al. | |
| 6,223,990 B1 | 5/2001 | Kamei | |
| 6,224,965 B1 | 5/2001 | Haas et al. | |

(Continued)

FOREIGN PATENT DOCUMENTS

EP    1092739    4/2001

(Continued)

OTHER PUBLICATIONS

Search Report (Application No. 08012865.5) dated Nov. 27, 2008.

*Primary Examiner* — Quoc D Hoang
(74) *Attorney, Agent, or Firm* — Eric J. Robinson; Robinson Intellectual Property Law Office, P.C.

(57) ABSTRACT

A semiconductor device capable of wireless communication, which has high reliability in terms of resistance to external force, in particular, pressing force and can prevent electrostatic discharge in an integrated circuit without preventing reception of an electric wave. The semiconductor device includes an on-chip antenna connected to the integrated circuit and a booster antenna which transmits a signal or power included in a received electric wave to the on-chip antenna without contact. In the semiconductor device, the integrated circuit and the on-chip antenna are interposed between a pair of structure bodies formed by impregnating a fiber body with a resin. One of the structure bodies is provided between the on-chip antenna and the booster antenna. A conductive film having a surface resistance value of approximately $10^6$ to $10^{14}$ $\Omega/cm^2$ is formed on at least one surface of each structure body.

33 Claims, 20 Drawing Sheets

U.S. PATENT DOCUMENTS

| | | |
|---|---|---|
| 6,376,333 B1 | 4/2002 | Yamazaki et al. |
| 6,403,221 B1 | 6/2002 | Nakamura et al. |
| 6,414,318 B1 | 7/2002 | Uber, III et al. |
| 6,509,217 B1 | 1/2003 | Reddy |
| 6,525,595 B2 | 2/2003 | Oku |
| 6,737,302 B2 | 5/2004 | Arao |
| 6,809,498 B2 | 10/2004 | Nakamura et al. |
| 6,960,955 B2 | 11/2005 | Nonaka |
| 6,963,269 B2 | 11/2005 | Saitoh et al. |
| 6,998,282 B1 | 2/2006 | Yamazaki et al. |
| 7,049,178 B2 | 5/2006 | Kim et al. |
| 7,050,138 B1 | 5/2006 | Yamazaki et al. |
| 7,061,083 B1 | 6/2006 | Usami et al. |
| 7,361,519 B2 | 4/2008 | Yamazaki et al. |
| 7,485,489 B2 | 2/2009 | Björbell |
| 7,746,234 B2 * | 6/2010 | Baba et al. ............... 340/572.8 |
| 2001/0019511 A1 | 9/2001 | Kondo et al. |
| 2002/0049714 A1 | 4/2002 | Yamazaki et al. |
| 2003/0032210 A1 | 2/2003 | Takayama et al. |
| 2003/0071953 A1 | 4/2003 | Yamazaki et al. |
| 2003/0121985 A1 | 7/2003 | Baldischweiler et al. |
| 2004/0001453 A1 | 1/2004 | Kawai et al. |
| 2004/0051666 A1 | 3/2004 | Aisenbrey |
| 2004/0102176 A1 | 5/2004 | Hayashi et al. |
| 2004/0128246 A1 | 7/2004 | Takayama et al. |
| 2004/0145454 A1 | 7/2004 | Powell et al. |
| 2005/0046464 A1 | 3/2005 | Kobayashi et al. |
| 2005/0070038 A1 | 3/2005 | Yamazaki et al. |
| 2005/0130389 A1 | 6/2005 | Yamazaki et al. |
| 2005/0133605 A1 | 6/2005 | Koyama et al. |
| 2005/0162131 A1 | 7/2005 | Sennami et al. |
| 2005/0162578 A1 | 7/2005 | Yamazaki et al. |
| 2005/0215119 A1 | 9/2005 | Kaneko |
| 2005/0233122 A1 | 10/2005 | Nishimura et al. |
| 2005/0254183 A1 | 11/2005 | Ishida et al. |
| 2006/0009251 A1 | 1/2006 | Noda et al. |
| 2007/0023758 A1 | 2/2007 | Tsurume et al. |
| 2007/0044303 A1 | 3/2007 | Yamano |
| 2007/0229279 A1 | 10/2007 | Yamazaki et al. |
| 2007/0229281 A1 | 10/2007 | Shionoiri et al. |
| 2007/0259585 A1 | 11/2007 | Yamazaki et al. |
| 2007/0278563 A1 | 12/2007 | Takano et al. |
| 2008/0012126 A1 | 1/2008 | Dozen et al. |
| 2008/0036680 A1 | 2/2008 | Ito et al. |
| 2008/0093934 A1 | 4/2008 | Kato |
| 2008/0093935 A1 | 4/2008 | Saito et al. |

FOREIGN PATENT DOCUMENTS

| | | |
|---|---|---|
| EP | 1589797 | 10/2005 |
| EP | 1 758 438 | 2/2007 |
| JP | 05-190582 | 7/1993 |
| JP | 06-150652 | 5/1994 |
| JP | 10-092980 | 4/1998 |
| JP | 10-307898 | 11/1998 |
| JP | 11-196540 | 7/1999 |
| JP | 2002-231545 | 8/2002 |
| JP | 2003-006592 | 1/2003 |
| JP | 2003-070187 | 3/2003 |
| JP | 2003-123033 | 4/2003 |
| JP | 2003-218624 | 7/2003 |
| JP | 2003-299255 | 10/2003 |
| JP | 2003-348773 | 12/2003 |
| JP | 2004-343410 | 12/2004 |
| JP | 2004-362341 | 12/2004 |
| JP | 2005-210843 | 8/2005 |
| JP | 2005-229098 | 8/2005 |
| JP | 2005-252853 | 9/2005 |
| JP | 2005-316724 | 11/2005 |
| JP | 2005-321911 | 11/2005 |
| JP | 2005-352434 | 12/2005 |
| JP | 2006-004015 | 1/2006 |
| JP | 2006-180073 | 7/2006 |
| JP | 2006-203852 | 8/2006 |
| JP | 2006-293690 | 10/2006 |
| WO | WO 01/01740 | 1/2001 |
| WO | WO 2004/001848 | 12/2003 |
| WO | WO 2006/043685 | 4/2006 |
| WO | WO 2007/016433 | 2/2007 |

* cited by examiner

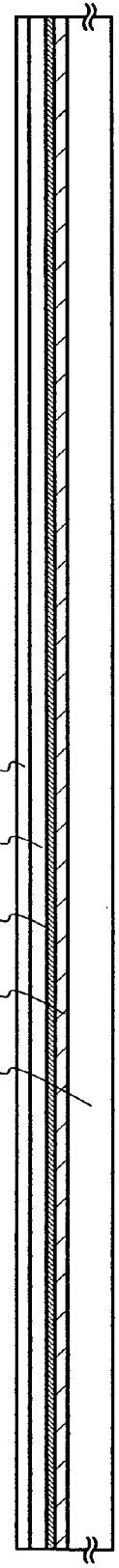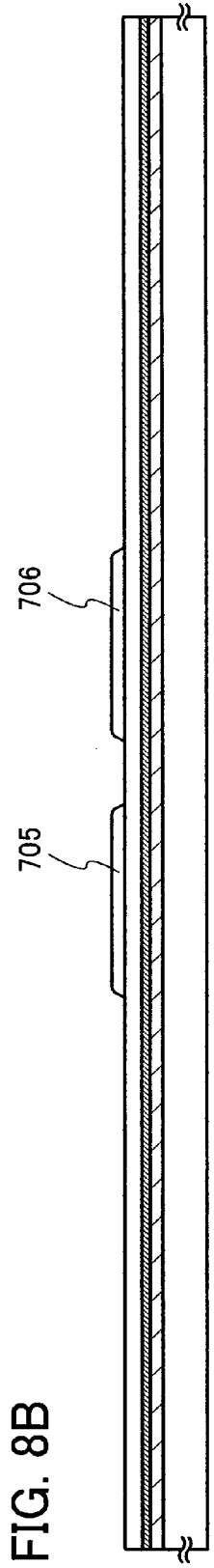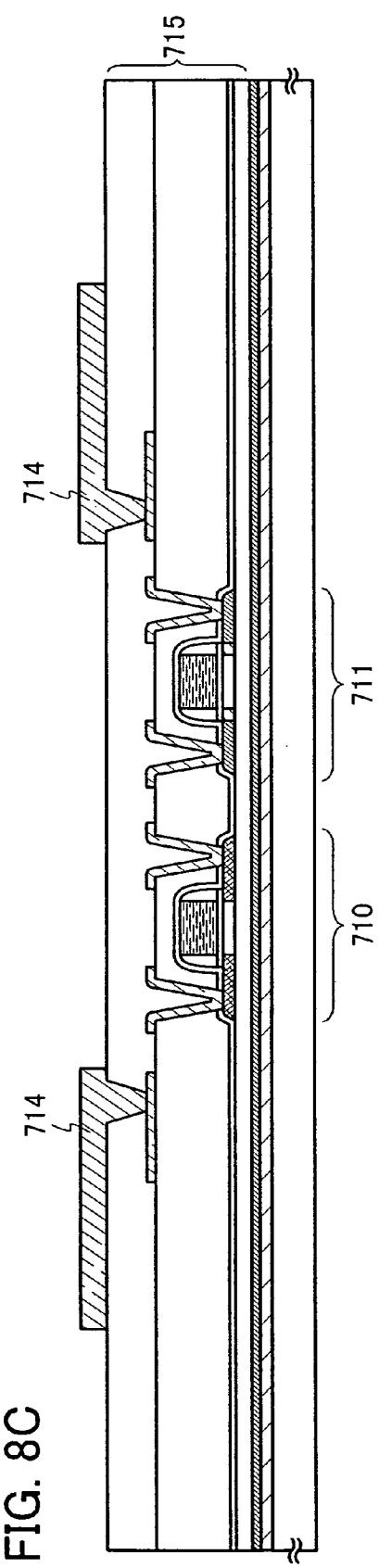

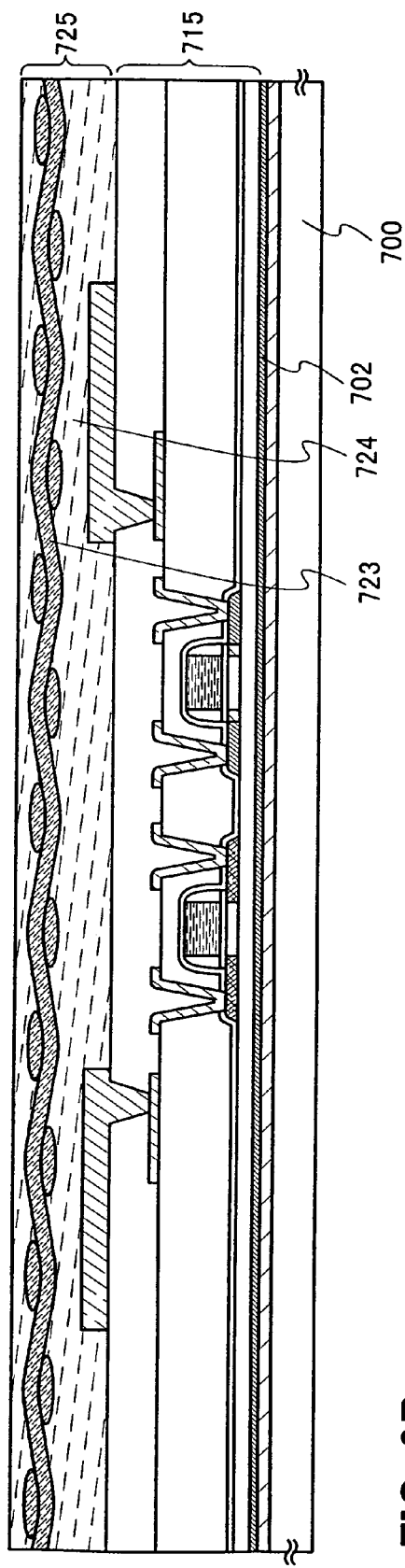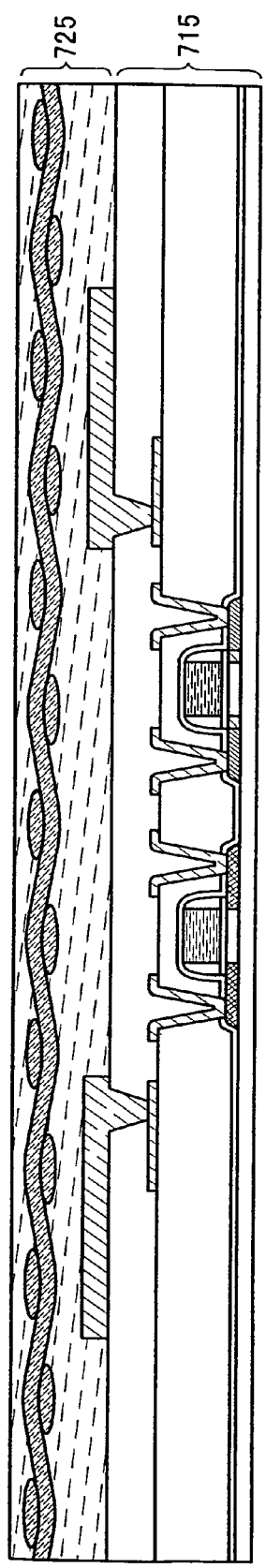
FIG. 9A
FIG. 9B

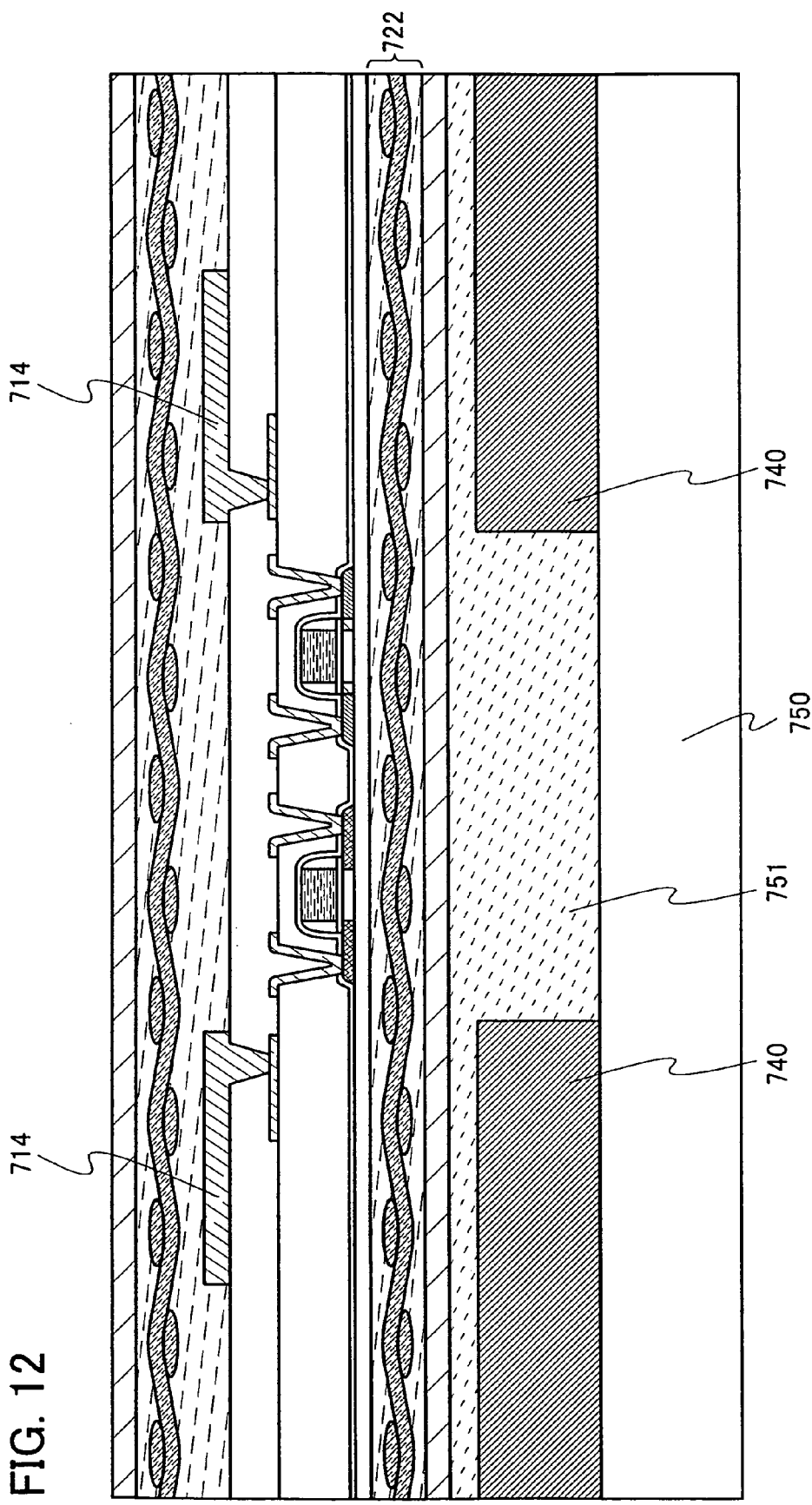

1801

1802

1803

1804

SEMICONDUCTOR DEVICE AND METHOD FOR MANUFACTURING THE SAME

BACKGROUND OF THE INVENTION

1. Field of the Invention

The present invention relates to a semiconductor device which can perform wireless communication and a manufacturing method thereof.

2. Description of the Related Art

A technology by which an individual object is identified by wirelessly transmitting and receiving signals (RFID: radio frequency identification) has been put into practical use in a variety of fields, and further expansion of the market for such a technology as a new mode of information communication is expected. An RF tag is also referred to as an ID chip, a wireless tag, or an IC tag, and typically includes an antenna and an integrated circuit (an IC chip) formed using a semiconductor substrate. In RFID, signals are generally transmitted and received wirelessly between an interrogator, which is also referred to as a reader or a reader/writer, and an RF tag. RF tags often take the form of cards, or chips, which are smaller than cards. However, they can take a variety of forms depending on intended use.

Further, when an RF tag itself has flexibility, the RF tag can be attached to a material having flexibility (a flexible material), such as paper or plastic. A structure of an RF tag using a flexible substrate is disclosed in Patent Document 1 (Japanese Published Patent Application No. 2005-229098). The RF tag having flexibility can be used more widely, and application of the RF tags to a wider range of fields can be expected.

SUMMARY OF THE INVENTION

Since RF tags are expected to be used in a variety of fields, it is an important object to secure reliability in any environment in practical application.

One example is reliability in terms of resistance to external force. RF tags are classified into the following types: a tag with an external antenna, in which an integrated circuit and an antenna are separately formed and connected; and a tag with an on-chip antenna, in which an integrated circuit and an antenna are formed (integrated) over one substrate. The tag with the external antenna has advantages in that there are no limitations on the size or the shape of the antenna and a communication range can be increased, unlike the tag with the on-chip antenna. However, in the case of an RF tag using a flexible substrate, connection between an integrated circuit and an antenna is easily cut when external force is applied to the substrate, and reliability in terms of resistance to external force is not quite sufficient compared with the tag with the on-chip antenna. Moreover, initial defects at a connection portion of the integrated circuit and the antenna cause reduction in yield compared with the tag with the on-chip antenna.

In order to add functions to the RF tag, the size of the integrated circuit and memory capacity is inevitably increased. However, along with increase in the circuit size and memory capacitor are increased, the area occupied by the integrated circuit also tends to increase, and thus, reliability of the RF tag in terms of resistance to external force is reduced. Accordingly, a problem occurs where the above-described advantages of the RF tag, which is that a variety of applications are expected, are not fully utilized. Further, even when the area occupied by the integrated circuit is not changed, there is still room for improvement in reliability of a tag in which a flexible substrate is used in terms of resistance to pressure (pressing force) that is locally applied from the outside.

In addition, in the integrated circuit, electrostatic discharge (ESD) occurs easily, in which a semiconductor element deteriorates or is damaged by discharge of charges accumulated by charging. In particular, charging occurs easily in an insulating substrate such as plastic. Accordingly, it is necessary not only to provide a protection circuit for securing a discharge path in the integrated circuit, but also to take measures against ESD for a substrate which supports the integrated circuit. When the RF tag is covered with a conductive substrate which can prevent charging in order to prevent ESD, an electric wave is likely to be blocked, which might affect reception of a signal or power from the interrogator.

In view of the foregoing problems, objects of the present invention are to provide high reliability in terms of resistance to external force, in particular, pressing force, and to prevent electrostatic discharge in an integrated circuit without preventing reception of an electric wave in a semiconductor device capable of wireless communication.

A semiconductor device of the present invention includes an on-chip antenna (a first antenna) which is connected to an integrated circuit and a booster antenna (a second antenna) which transmits a signal or power included in a received electric wave to the on-chip antenna without contact. In the semiconductor device of the present invention, the integrated circuit and the on-chip antenna are interposed between a pair of structure bodies formed by impregnating a fiber body with a resin. One of the structure bodies is provided between the on-chip antenna and the booster antenna. A conductive antistatic film having a surface resistance value of approximately $10^6$ to $10^{14}$ $\Omega/cm^2$ is formed on at least one surface of each structure body. The antistatic film may be formed on the side facing the integrated circuit and the on-chip antenna, or the side not facing the integrated circuit and the on-chip antenna. Further, the antistatic film may be formed on either surface of the structure body or both of the surfaces of the structure body.

Specifically, the structure body can be formed by impregnating a fiber body of an organic compound or an inorganic compound with an organic resin. A layer (an element layer) including the integrated circuit and the structure body can be fixed to each other by thermocompression bonding. Alternatively, a layer for fixing the element layer and the structure body may be provided. Further alternatively, a fiber body is placed on an element layer and then, the fiber body is impregnated with an organic resin, thereby forming the structure body fixed to the element layer.

The thickness of the element layer is 1 to 10 μm, and preferably 1 to 5 μm. The total thickness of the pair of structure bodies is preferably 20 to 100 μm. With such thickness, a semiconductor device which can be bent can be manufactured.

As the fiber body, a woven fabric or a nonwoven fabric using a high-strength fiber of an organic compound or an inorganic compound can be used. The high-strength fiber is specifically a fiber with a high tensile modulus of elasticity or a high Young's modulus. By using the high-strength fiber as the fiber body, even when pressing force is locally applied to a semiconductor device, the pressure is distributed to the whole fiber body, and a part of the semiconductor device being stretched can be prevented. That is, destruction of a wiring, a semiconductor element, or the like due to stretching of a part of the semiconductor device can be prevented. Further, as the organic resin, a thermoplastic resin or a thermosetting resin can be used.

According to the present invention, in a semiconductor device capable of wireless communication, high reliability in terms of resistance to external force, in particular, pressing force, can be provided and electrostatic discharge in an integrated circuit can be prevented without preventing reception of an electric wave.

BRIEF DESCRIPTION OF THE DRAWINGS

FIGS. 8A to 8C illustrate a method of manufacturing a semiconductor device of the present invention.

FIGS. 9A and 9B illustrate a method of manufacturing a semiconductor device of the present invention.

FIG. 12 illustrates a method of manufacturing a semiconductor device of the present invention.

DETAILED DESCRIPTION OF THE INVENTION

Hereinafter, embodiment modes and embodiments of the present invention will be described in detail with reference to the accompanying drawings. Note that it is easily understood by those skilled in the art that modes and details can be modified in various ways without departing from the purpose and the scope of the present invention. Therefore, the present invention is not construed as being limited to description of the embodiment modes and the embodiments.

Embodiment Mode 1

Figure 1A:
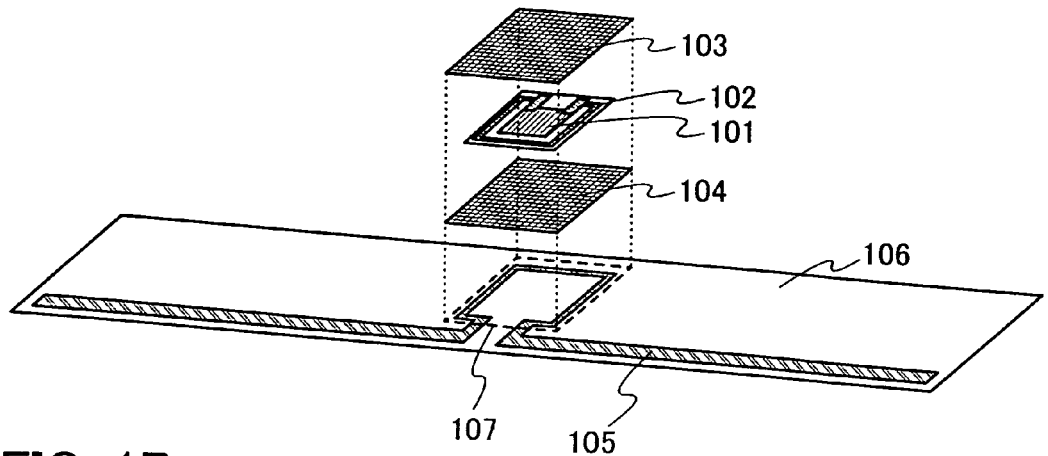
FIGS. 1A and 1B each are a perspective view illustrating a structure of a semiconductor device of the present invention.

FIG. 1A is a perspective view illustrating a stacked-layer structure of a semiconductor device of the present invention. The semiconductor device of the present invention includes an integrated circuit 101 and an on-chip antenna 102 connected to the integrated circuit 101. The integrated circuit 101 and the on-chip antenna 102 are formed in an integrated manner. That is, the on-chip antenna 102 is directly formed on the integrated circuit 101 and is formed so as to be connected to the integrated circuit 101. The integrated circuit 101 and the on-chip antenna 102 are provided between structure bodies 103 and 104 formed by impregnating a fiber body with a resin. Moreover, the semiconductor device of the present invention includes a booster antenna 105. The structure body 104 is interposed between the on-chip antenna 102 and the booster antenna 105. Note that FIG. 1A illustrates an example in which the booster antenna 105 is formed over a supporting substrate 106.

Figure 4A:
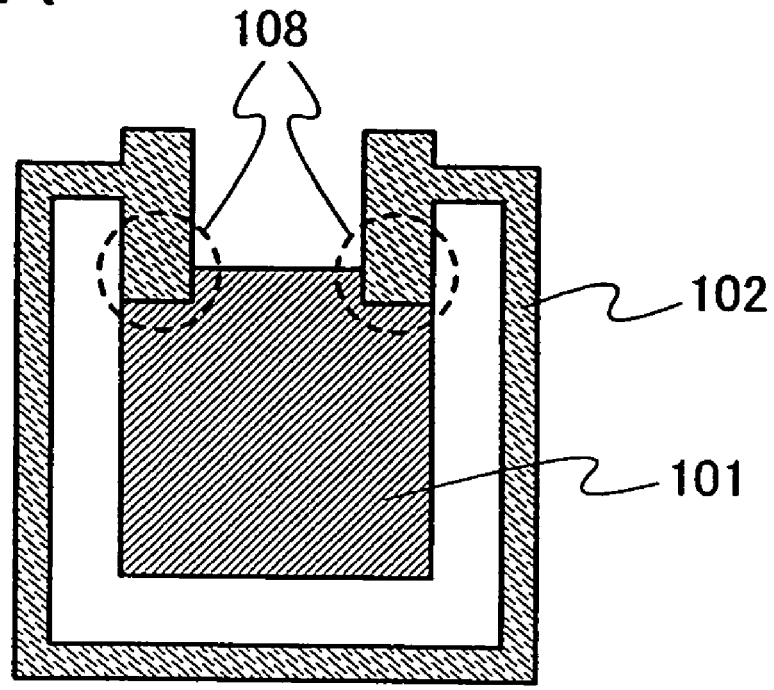
FIGS. 4A and 4B each illustrate a positional relationship between an integrated circuit and an on-chip antenna.

FIG. 4A is a magnified view of the on-chip antenna 102 and the integrated circuit 101 shown in FIG. 1A. Although the on-chip antenna 102 is a rectangular loop antenna with one winding in FIGS. 1A and 4A, the present invention is not limited to this structure. The shape of the loop antenna is not limited to a rectangle and may be a shape having a curve, for example, a circle. The number of windings is not limited to one and may be plural times. Note that when the on-chip antenna 102 has one winding, parasitic capacitance generated between the integrated circuit 101 and the on-chip antenna 102 can be reduced.

Figure 4B:
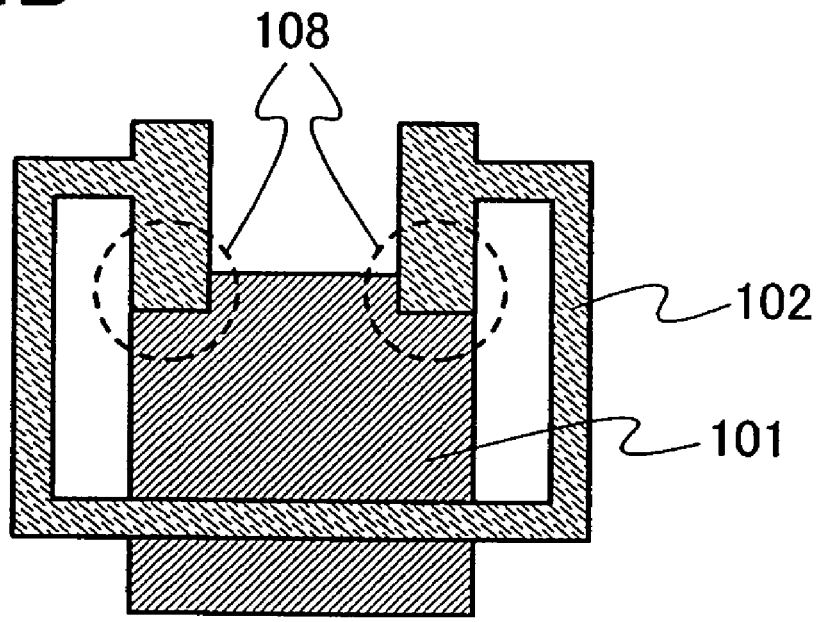

Further, in FIGS. 1A and 4A, the on-chip antenna 102 is arranged so as to surround the periphery of the integrated circuit 101. The on-chip antenna 102 is provided in a region where the integrated circuit 101 is not provided, except for a portion corresponding to a power feeding portion 108 shown by dashed lines. Note that the present invention is not limited to this structure, and as shown in FIG. 4B, the on-chip antenna 102 may be arranged so as to at least partially overlap with the integrated circuit 101 except for a portion corresponding to the power feeding portion 108 shown by dashed lines. Note that when the on-chip antenna 102 is arranged in a region where the integrated circuit 101 is not provided as shown in FIGS. 1A and 4A, parasitic capacitance generated between the integrated circuit 101 and the on-chip antenna 102 can be reduced.

In addition, the booster antenna 105 is rectangular loop-shaped with one winding in a portion surrounded by a dashed line 107; however, the present invention is not limited to this structure. A loop-shaped portion of the booster antenna 105 is not limited to rectangular and may be a shape having a curve, for example, a circle. The number of windings is not limited to one and may be plural times.

The booster antenna 105 can transmit and receive signals or supply power to/from the on-chip antenna 102 by electromagnetic induction mainly in the loop-shaped portion surrounded by the dashed line 107. Moreover, the booster antenna 105 can transmit and receive signals or supply power to/from an interrogator by an electric wave mainly in regions except for the portion surrounded by the dashed line 107. Between the interrogator and the semiconductor device, frequency of an electric wave used as a carrier (a carrier wave) is preferably approximately 30 MHz to 5 GHz, and a frequency band of 950 MHz or 2.45 GHz may be used, for example.

Figure 1B:
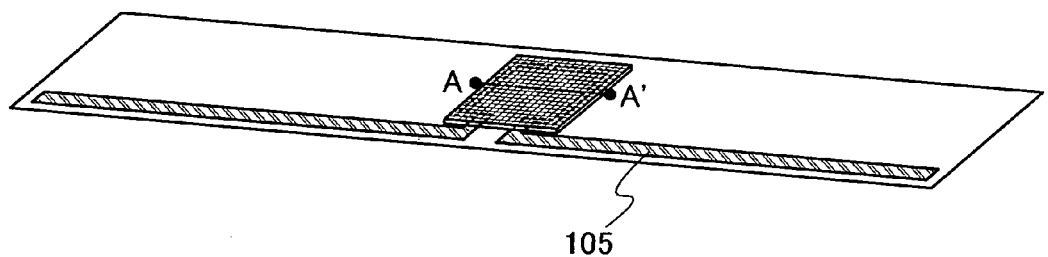
Figure 1C:
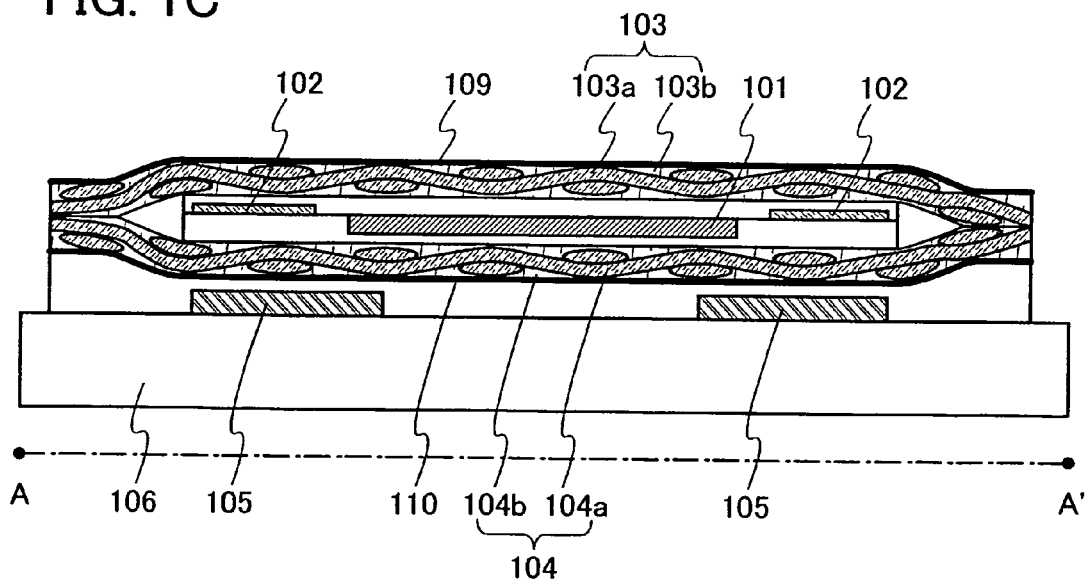
FIG. 1C is a cross-sectional view of FIG. 1B.

Next, structures and arrangement of the structure bodies 103 and 104 are described. FIG. 1B is a perspective view of a semiconductor device of the present invention in which the integrated circuit 101, the on-chip antenna 102, the structure bodies 103 and 104, and the booster antenna 105 formed over the supporting substrate 106, which are shown in FIG. 1A, are stacked. FIG. 1C is a cross-sectional view of a dashed line A-A' in FIG. 1B.

The structure body 103 includes a fiber body 103a of an organic compound or an inorganic compound and an organic resin 103b impregnated into the fiber body 103a. In a similar manner, the structure body 104 includes a fiber body 104a of an organic compound or an inorganic compound and an organic resin 104b impregnated into the fiber body 104a.

Note that this embodiment mode illustrates the case where a single-layer fiber body is used in the structure bodies 103 and 104; however, the present invention is not limited to this structure. In each structure body, two or more layers of fiber bodies may be stacked. In particular, when three or more layers of fiber bodies are used in each structure body, reliability of the semiconductor device in terms of resistance to external force, especially pressing force can be improved. Further, the structure bodies 103 and 104 may include different numbers of fiber bodies.

The integrated circuit 101 and the on-chip antenna 102 are provided between the structure bodies 103 and 104. The structure body 104 is provided between the on-chip antenna 102 and the booster antenna 105. Note that in FIG. 1C, the integrated circuit 101 is provided closer to the booster antenna 105 than the on-chip antenna 102; however, the present invention is not limited to this structure. The on-chip antenna 102 may be provided closer to the booster antenna 105 than the integrated circuit 101.

Further, in the present invention, an antistatic film 109 and an antistatic film 110 having conductivity and a surface resistance value of approximately $10^6$ to $10^{14}$ $\Omega/cm^2$ is formed on at least one surface of the structure bodies 103 and 104, respectively. Specifically, in FIG. 1C, the antistatic film 109 is formed on the side above the integrated circuit 101 and the on-chip antenna 102, with the structure body 103 interposed therebetween. Note that the present invention is not limited to this structure. The antistatic film 109 may be provided between the structure body 103, and the integrated circuit 101 and the on-chip antenna 102, or two antistatic films 109 may be formed with the structure body 103 interposed therebetween. In a similar manner, in FIG. 1C, the antistatic film 110 is formed on the side below the integrated circuit 101 and the on-chip antenna 102, with the structure body 104 interposed therebetween. Note that the present invention is not limited to this structure. The antistatic film 110 may be provided between the structure body 104, and the integrated circuit 101 and the on-chip antenna 102, or two antistatic films 110 may be formed with the structure body 104 interposed therebetween.

Figure 3A:
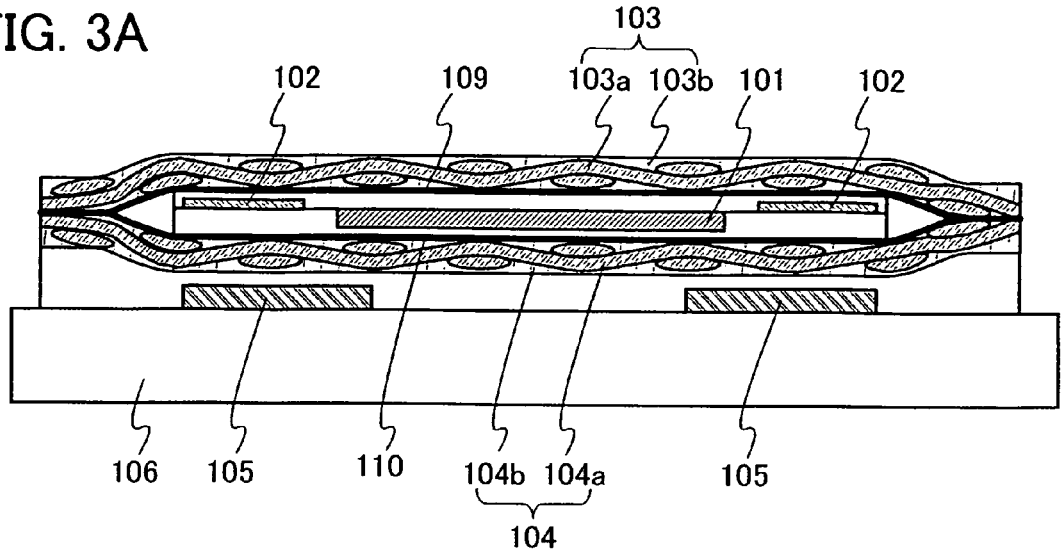
FIGS. 3A to 3C each are a cross-sectional view of a semiconductor device of the present invention.
Figure 3B:
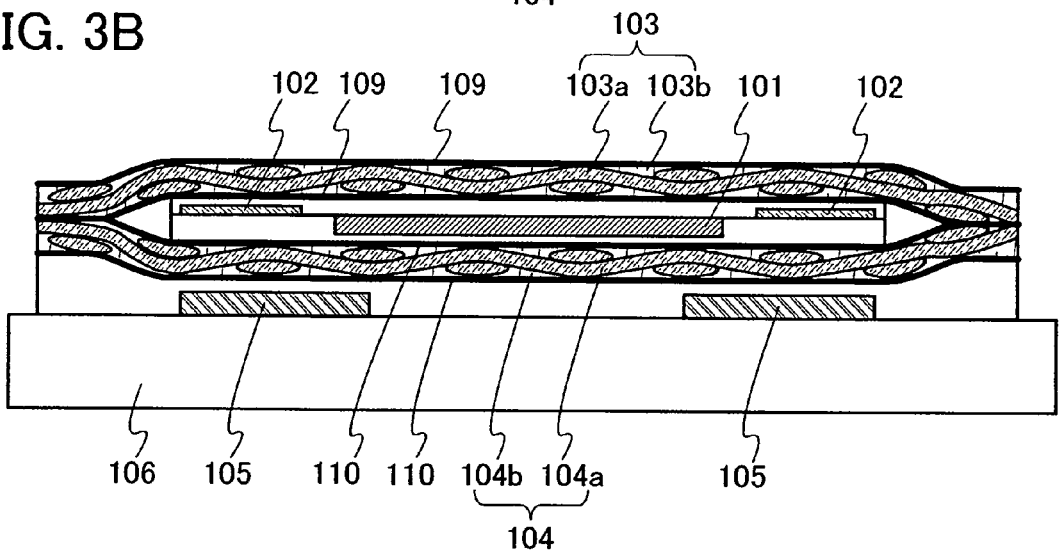
Figure 3C:
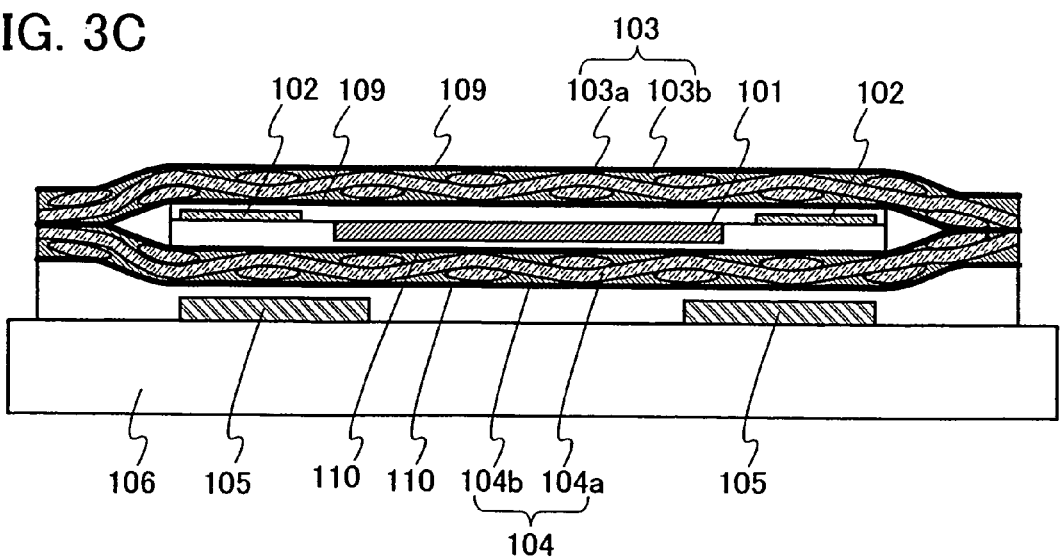

FIG. 3A is a cross-sectional view along the dashed line A-A' in the case where the antistatic film 109 is provided between the structure body 103, and the integrated circuit 101 and the on-chip antenna 102; and the antistatic film 110 is provided between the structure body 104, and the integrated circuit 101 and the on-chip antenna 102. FIG. 3B is a cross-sectional view along the dashed line A-A' in the case where the antistatic film 109 is formed on both of the surfaces of the structure body 103; and the antistatic film 110 is formed on both of the surfaces of the structure body 104. FIG. 3C is a cross-sectional view along the dashed line A-A' in the case where two antistatic films 109 are formed with the structure body 103 interposed therebetween, two antistatic films 110 are formed with the structure body 104 interposed therebetween, and a material used in the antistatic film 109 or the antistatic film 110 is dispersed in the organic resin 103b included in the structure body 103 and the organic resin 104b included in the structure body 104.

For the antistatic films 109 and 110, a surfactant, a conductive polymer, a resin in which conductive particles such as carbon black or silver are dispersed, a siloxane-based resin, a siloxane-based material, or the like can be used. Specific examples of the surfactant include a nonionic surfactant such as glycerin fatty acid ester, polyoxyethylene alkyl ether, polyoxyethylene alkyl phenyl ether, N,N-bis(2-hydroxyethyl) alkylamine, N-2-hydroxyethyl-N-2-hydroxyalkylamine, polyoxyethylene alkylamine, polyoxyethylene alkylamine fatty acid ester, and alkyl diethanolamide; an anionic surfactant such as alkyl sulfonate, alkyl benzene sulfonate, and alkyl phosphate; a cationic surfactant such as tetraalkylammonium salt and trialkylbenzylammonium salt; and an amphoteric surfactant such as alkyl betaine and alkyl imidazolium betaine. When the surfactant is used, the thickness of each of the antistatic films 109 and 110 is preferably approximately 0.01 to 1 µm. Examples of the conductive polymer include polypyrrole-based and polythiophene-based polymers. Note that the siloxane-based resin is a resin formed from a siloxane-based material as a starting material and having the bond of Si—O—Si. The siloxane-based resin may contain at least one of fluorine, an alkyl group, and aromatic hydrocarbon, in addition to hydrogen as a substituent. Oligomer is also included in the siloxane-based resin.

The integrated circuit 101 and the on-chip antenna 102 may be fixed to the structure bodies 103 and 104 directly or with an adhesion layer functioning as an adhesive.

The thickness of the structure body 103 and the thickness of the structure body 104 are made approximately the same, specifically, a ratio of the thickness of one structure body to the thickness of the other structure body is 1:0.8 to 1:1.2, and the same material is used for the organic resins 103b and 104b, whereby warping of the semiconductor device can be reduced. Moreover, by making the thickness of the structure body 103 and the thickness of the structure body 104 approximately the same, specifically, by making a ratio of the thickness of one structure body to the thickness of the other structure body is 1:0.8 to 1:1.2, when the semiconductor device is bent by application of stress, pressure can be prevented from being locally applied to the integrated circuit 101 and the on-chip antenna 102 provided between the structure bodies 103 and 104. Thus, reliability of the semiconductor device can be improved.

Specifically, the thickness of the structure bodies 103 and 104 together is preferably 20 to 100 µm. A thin semiconductor device capable of being bent can be formed using the structure bodies having the above-described thickness.

As the organic resins 103b and 104b, a thermosetting resin such as an epoxy resin, an unsaturated polyester resin, a polyimide resin, a bismaleimide-triazine resin, or a cyanate resin; a thermoplastic resin such as a polyphenylene oxide resin, a polyetherimide resin, or a fluorine resin; or a plurality of the above-described thermosetting resins and the thermoplastic resins can be used. By using the above-described organic resin, the fiber body can be fixed to the integrated circuit 101 and the on-chip antenna 102 by heat treatment. Note that the higher the glass transition temperature of the organic resins 103b and 104b is, the less the integrated circuit 101 and the on-chip antenna 102 are damaged by locally applied pressure, which is preferable.

Highly thermally conductive filler may be dispersed in the organic resins 103b and 104b or in bundles of fibers. Examples of the highly thermally conductive filler include aluminum nitride, boron nitride, silicon nitride, alumina, and metal particles of silver, copper, or the like. When the highly thermally conductive filler is included in the organic resin or the bundles of fibers, heat generated in the integrated circuit 101 and the on-chip antenna 102 can be easily released to the outside. Accordingly, thermal storage in the semiconductor device can be suppressed, and destruction of the semiconductor device can be reduced.

Each of the fiber bodies 103a and 104a is a woven fabric or a nonwoven fabric using a high-strength fiber of an organic compound or an inorganic compound. The fiber bodies 103a and 104a are disposed so as to overlap with the entire surface of the integrated circuit 101 and the on-chip antenna 102. The high-strength fiber is specifically a fiber with a high tensile modulus of elasticity or a high Young's modulus. Typical examples of the high-strength fiber include a polyvinyl alcohol fiber, a polyester fiber, a polyamide fiber, a polyethylene fiber, an aramid fiber, a polyparaphenylene benzobisoxazole fiber, a glass fiber, and a carbon fiber. Examples of the glass fiber include a glass fiber using E glass, S glass, D glass, Q glass, and the like. Note that the fiber bodies 103a and 104a may be formed from one kind or a plurality of the above-described high-strength fibers.

Alternatively, the fiber bodies 103a and 104a may be a woven fabric formed using bundles of fibers (single yarns) (hereinafter, the bundles of fibers are referred to as yarn bundles) for the warp yarn and the weft yarn, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a cross section of a circular shape or an elliptical shape. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A yarn bundle of fibers which is subjected to fiber opening has a large width, has a smaller number of single yarns in the thickness direction, and has a cross section of an elliptical shape or a flat shape. Further, when a loosely twisted yarn is used as the yarn bundle of fibers, the yarn bundle is easily flattened and has a cross section of an elliptical shape or a flat shape. By using a yarn bundle having a cross section of an elliptical shape or a flat shape as described above, it is possible to make the fiber bodies 103a and 104a thin. Accordingly, the structure bodies 103 and 104 can be made to be thin, and thus, a thin semiconductor device can be manufactured. An effect of the present invention is confirmed when the diameter of the yarn bundle is 4 to 200 μm as well as 4 to 400 μm. Theoretically, the diameter of the yarn bundle may be even smaller. Moreover, an effect of the present invention is confirmed when the thickness of the fiber is 4 to 20 μm. Theoretically, the thickness of the fiber may be even smaller, and the thickness of the fiber depends on a material of the fiber.

Note that in the drawings of this specification, the fiber bodies 103a and 104a are shown as woven fabrics which are plain-woven using yarn bundles each having a cross section of an elliptical shape.

Figure 5A:
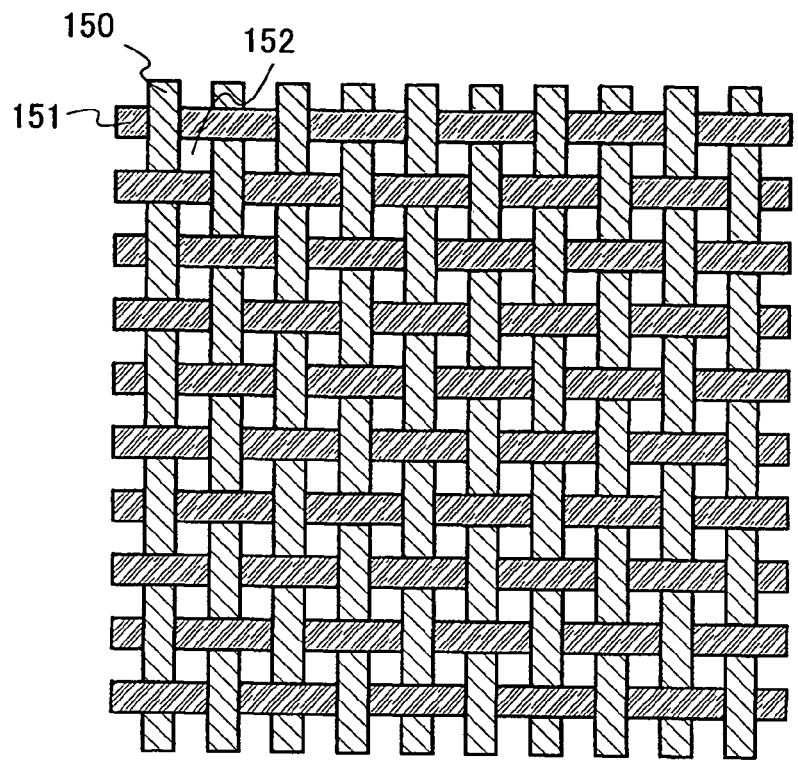
FIGS. 5A and 5B each are a top plan view of a fiber body.
Figure 5B:
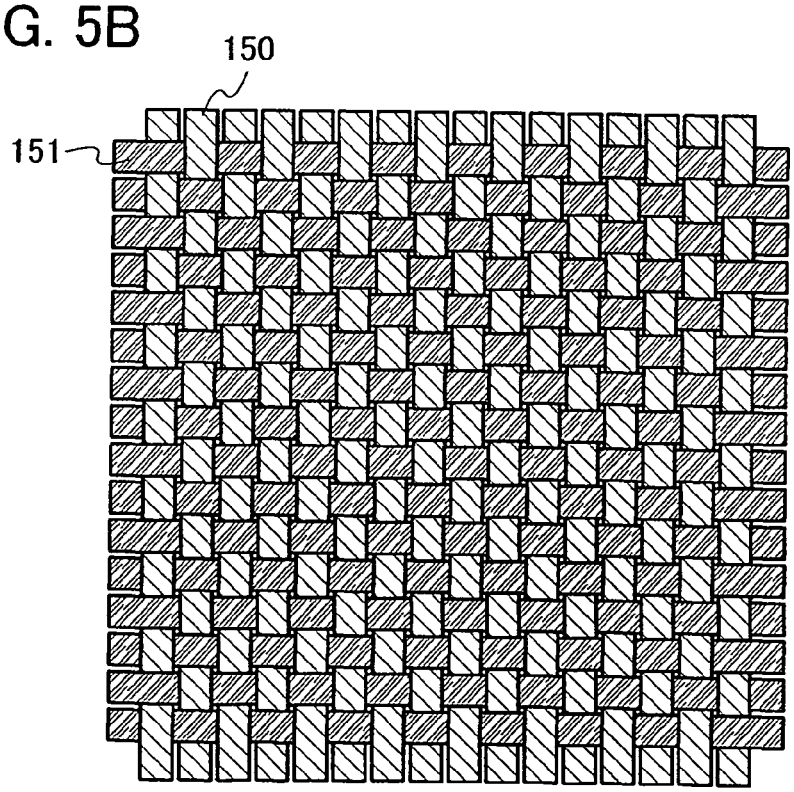

FIGS. 5A and 5B each are a top plan view of the fiber bodies 103a and 104a which are woven fabrics formed using yarn bundles of fibers for the warp yarn and the weft yarn.

As shown in FIG. 5A, the fiber bodies 103a and 104a are woven using warp yarns 150 spaced at regular intervals and weft yarns 151 spaced at regular intervals. Such a fiber body formed using the warp yarns 150 and the weft yarns 151 has regions (basket holes 152) without the warp yarns 150 and the weft yarns 151. The organic resins 103b and 104b are further impregnated into such fiber bodies 103a and 104a; thus, adhesion between the fiber bodies 103a and 104a, and the integrated circuit 101 and the on-chip antenna 102 can be further increased.

As shown in FIG. 5B, in each of the fiber bodies 103a and 104a, the density of the warp yarns 150 and the weft yarns 151 may be high and the proportion of the basket holes 152 may be low. Typically, the size of the basket hole 152 is preferably smaller than the area of a locally pressed portion, and preferably has a rectangular shape having a side with a length of 0.01 to 0.2 mm. When the basket hole 152 in each of the fiber bodies 103a and 104a has such a small area, pressure can be absorbed by the entire fiber bodies 103a and 104a even if the fiber bodies 103a and 104a are pressed by a member with a sharp tip (typically, a writing material such as a pen or a pencil).

Further, in order to enhance permeability of an organic resin into the inside of the yarn bundle of fibers, the fiber may be subjected to surface treatment. Examples of the surface treatment include corona discharge, plasma discharge, and the like for activating a surface of the fiber as well as surface treatment using a silane coupling agent or a titanate coupling agent.

The thickness of the integrated circuit 101 is preferably 1 to 10 μm, more preferably 1 to 5 μm. With the integrated circuit 101 having such a thickness, a semiconductor device capable of being bent can be manufactured.

When the fiber bodies 103a and 104a are woven fabrics using the warp yarns and the weft yarns, directions of the warp yarns and the weft yarns may be different in the fiber bodies. When the fiber bodies 103a and 104a have different directions of the warp yarns and the weft yarns, reliability of the semiconductor device in terms of resistance to deflection in any direction can be secured. Further, since the structure bodies 103 and 104 have different tensile directions when pressing force is applied, extension by local pressing becomes isotropic. Thus, destruction of the semiconductor device due to pressing can be further reduced. Variation of the directions of the warp yarns and the weft yarns of the fiber bodies is preferably 30° to 60°, especially 40° to 50°. Note that when each fiber body includes a plurality of stacked fiber bodies, directions of the warp yarns and the weft yarns may be different from each other in one structure body.

In the structure bodies 103 and 104 used in the present invention, a high-strength fiber with a high tensile modulus of elasticity or a high Young's modulus is used as the fiber body. Thus, even when locally applied pressure such as point pressure or linear pressure is applied, pressing force is distributed to the whole fiber body. Accordingly, a semiconductor element, a wiring, and the like which are included in the integrated circuit 101 are not cracked, and thus, the semiconductor device can be prevented from being destroyed. Further, since a thin semiconductor film is used, the integrated circuit 101 can be made thin. Accordingly, unlike the case of using a bulk semiconductor element, the semiconductor device is not easily destroyed even when the semiconductor device is bent.

Figure 2:
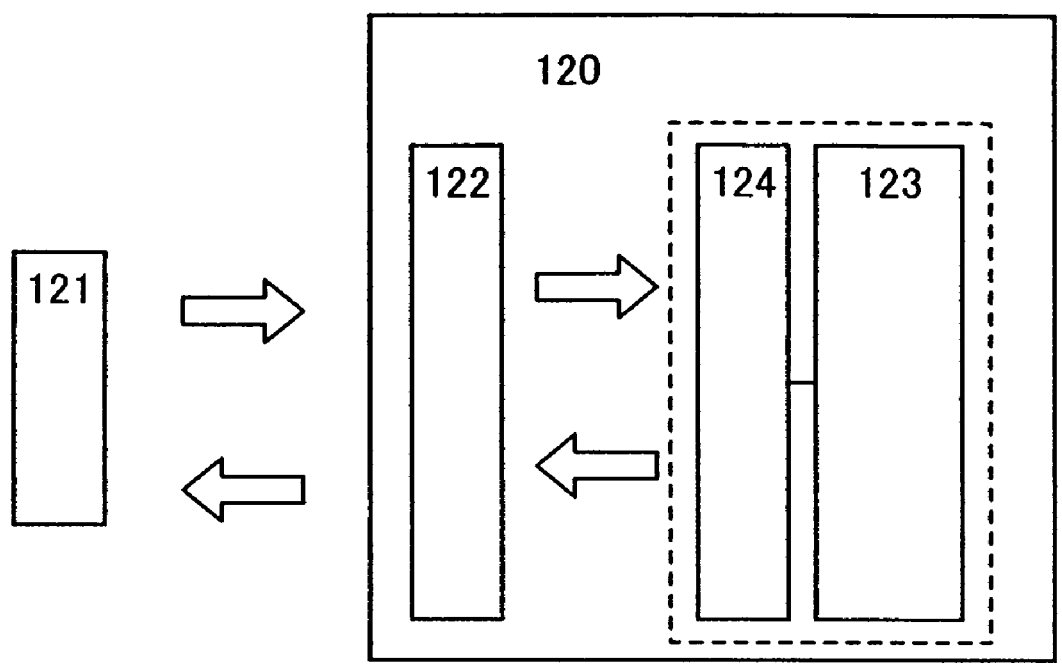
FIG. 2 is a block diagram illustrating a structure of a semiconductor device of the present invention.

Next, operations of the semiconductor device of the present invention are described. FIG. 2 illustrates an example of a block diagram illustrating a structure of the semiconductor device of the present invention. A semiconductor device 120 shown in FIG. 2 includes a booster antenna 122, an integrated circuit 123, and an on-chip antenna 124. When an electric wave is transmitted from an interrogator 121, the booster antenna 122 receives the electric wave; thus, alternating current is generated in the booster antenna 122, and a magnetic field is generated around the booster antenna 122. Then, a loop-shaped portion included in the booster antenna 122 and the on-chip antenna 124 having a loop shape are electromagnetically coupled to each other, so that induced electromotive force is generated in the on-chip antenna 124. The integrated circuit 123 receives a signal or power from the interrogator 121 by using the induced electromotive force. In contrast, when current flows through the on-chip antenna 124 in accordance with a signal generated in the integrated circuit 123 so that induced electromotive force is generated in the booster antenna 122, a signal can be transmitted to the interrogator 121 over a reflected wave of an electric wave transmitted from the interrogator 121.

Note that the booster antenna 122 can be divided into the loop-shaped portion which is chiefly electromagnetically coupled to the on-chip antenna 124 and a portion which chiefly receives an electric wave from the interrogator 121. It is acceptable as long as the booster antenna 122 in the portion which chiefly receives an electric wave from the interrogator 121 has a shape which makes it possible to receive an electric wave, for example, a shape of a dipole antenna, a folded dipole antenna, a slot antenna, a meander line antenna, a microstrip antenna, or the like.

Figure 6:
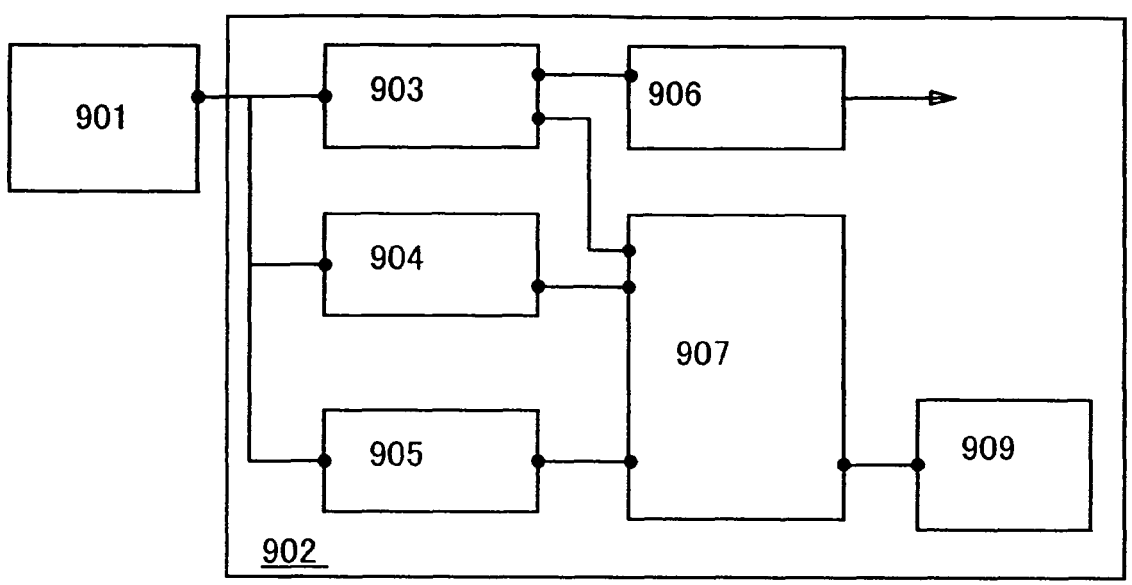
FIG. 6 is a block diagram illustrating a structure of an integrated circuit.

Next, a structure of an integrated circuit included in the semiconductor device of the present invention is described. FIG. 6 is a block diagram illustrating one mode of an integrated circuit 902 connected to an on-chip antenna 901. The integrated circuit 902 includes a power supply circuit 903, a demodulation circuit 904, a modulation circuit 905, a regulator 906, a control circuit 907, and a memory 909.

When alternating current flows through a booster antenna, alternating current voltage is generated in the on-chip antenna 901 by induced electromotive force. In the power supply circuit 903, the alternating current voltage from the on-chip antenna 901 is rectified, and voltage for power supply is generated. The voltage for power supply generated in the power supply circuit 903 is applied to the control circuit 907 and the regulator 906. The regulator 906 stabilizes the voltage for power supply from the power supply circuit 903 or adjusts the level of the voltage, and thereafter, supplies the resulting voltage to various circuits such as the demodulation circuit 904, the modulation circuit 905, the control circuit 907, or the memory 909 in the integrated circuit 902.

The demodulation circuit 904 demodulates an alternating current signal received by the on-chip antenna 901 and outputs the resulting signal to the control circuit 907 that comes next. The control circuit 907 performs arithmetic processing in accordance with the signal input from the demodulation circuit 904, and separately generates a signal. When the control circuit 907 performs the arithmetic processing, the memory 909 can be used as a primary cache memory or a secondary cache memory. Moreover, the control circuit 907 analyzes the signal input from the demodulation circuit 904, and stores output of information in the memory 909 or contents of instructions in the memory 909 in accordance with contents of instructions transmitted from an interrogator. A signal output from the control circuit 907 is encoded and transmitted to the modulation circuit 905. The modulation circuit 905 applies alternating current voltage to the on-chip antenna 901 in accordance with the signal, by which an electric wave that the booster antenna is receiving is modulated. The electric wave modulated by the on-chip antenna 901 is received by the interrogator. Note that there are a variety of modulation methods such as amplitude modulation, frequency modulation, and phase modulation depending on the standards, and any modulation method can be used as long as it meets the standards.

The memory 909 can be a nonvolatile memory or a volatile memory. As the memory 909, a DRAM (dynamic random access memory), an SRAM (static random access memory), a FeRAM, a mask ROM (read only memory), an EPROM (electrically programmable read only memory), an EEPROM (electrically erasable and programmable read only memory), a flash memory, an organic memory, or the like can be used, for example.

In the present invention, the semiconductor device shown in FIG. 6 may be provided with an oscillation circuit or a secondary battery.

Although FIG. 6 describes the structure of the semiconductor device including just one on-chip antenna, the present invention is not limited to this structure. A semiconductor device may include two on-chip antennas, an on-chip antenna for receiving power and an on-chip antenna for receiving a signal. When two on-chip antennas are provided, frequency of an electric wave for supplying power and frequency of an electric wave for transmitting a signal can be separately used.

In the semiconductor device of the present invention, an on-chip antenna is used, and a signal or power can be transmitted and received between a booster antenna and the on-chip antenna without contact. Accordingly, unlike the case where an external antenna is connected to an integrated circuit, connection between an integrated circuit and the antenna is not likely to be cut by external force, and occurrence of initial defects of the connection can be suppressed. Further, since the booster antenna is used in the present invention, unlike the case where only an on-chip antenna is used, the following advantages of an external antenna can be obtained. For example, the size or the shape of the antenna is less limited by the area of the integrated circuit, a frequency band of an electric wave that the antenna can receive is not particularly limited, and a communication range can be increased.

In addition, in the present invention, a pair of structure bodies formed by impregnating a fiber body with a resin is used, whereby reliability of the semiconductor device in terms of resistance to external force, especially pressing force can be improved. Moreover, when a conductive antistatic film having a surface resistance value of approximately $10^6$ to $10^{14}$ $\Omega/cm^2$ is formed on at least one surface of each structure body, the structure bodies can be prevented from being charged when the structure bodies have insulating properties while allowing transmittance of electric waves. Further, since the booster antenna is not connected to the integrated circuit and the on-chip antenna in the present invention, the integrated circuit and the on-chip antenna can be completely surrounded by a pair of structure bodies. Accordingly, not only reliability of the semiconductor device in terms of resistance to external force can be improved, but also reliability of the semiconductor device can be improved by preventing impurities such as alkali metal such as Na, alkaline earth metal, or moisture which adversely affect characteristics of a semiconductor element from entering the integrated circuit.

Since the semiconductor device of the present invention has high reliability in terms of resistance to external force, conditions of environment in which the semiconductor device can be used can be expanded, and a range of application of the semiconductor device can be extended.

Embodiment Mode 2

The inventors examined an operation rate of the semiconductor device of the present invention when voltage is applied using an ESD tester.

In the test for the operation rate of the semiconductor devices, all samples have a structure in which an on-chip antenna and an integrated circuit are interposed between a pair of structure bodies each including a single-layer fiber body. The area of the semiconductor device is 0.5 mm×12.0 mm. The fiber body is plain-woven using the warp yarn and the weft yarn. A sample A is a sample in which an antistatic film is not formed. A sample B is a sample in which an antistatic film is formed on the side of each structure body, which does not face the on-chip antenna and the integrated circuit as in FIG. 1C, and a cationic surfactant (product name: Staticide (registered trademark), manufactured by ACL Staticide Inc.) is used for the antistatic film. A sample C is a sample in which an antistatic film is formed on the side of each structure body, which faces the on-chip antenna and the integrated circuit as in FIG. 3A, and a polythiophene-based conductive polymer (product name: CONISOL (registered trademark), manufactured by InsCon Tech Co., Ltd.) is used for the antistatic film.

In the test, all voltage is applied to a center portion of the integrated circuit through the structure body by contact discharge. Steps of the test are as follows. First, a voltage of +1 kV is applied for the first time and then, electricity is removed by an ionizer for approximately 10 seconds. Next, a voltage of −1 kV is applied for the next time and then, electricity is removed by the ionizer for approximately 10 seconds. Then, an operation of the semiconductor device is checked by reading of data by an interrogator. As for a sample whose operation has been checked, the voltage to be applied for the first time is increased by +1 kV, the voltage to be applied for the second time is increased by −1 kV, and the operation is checked in similar steps.

Figure 7:
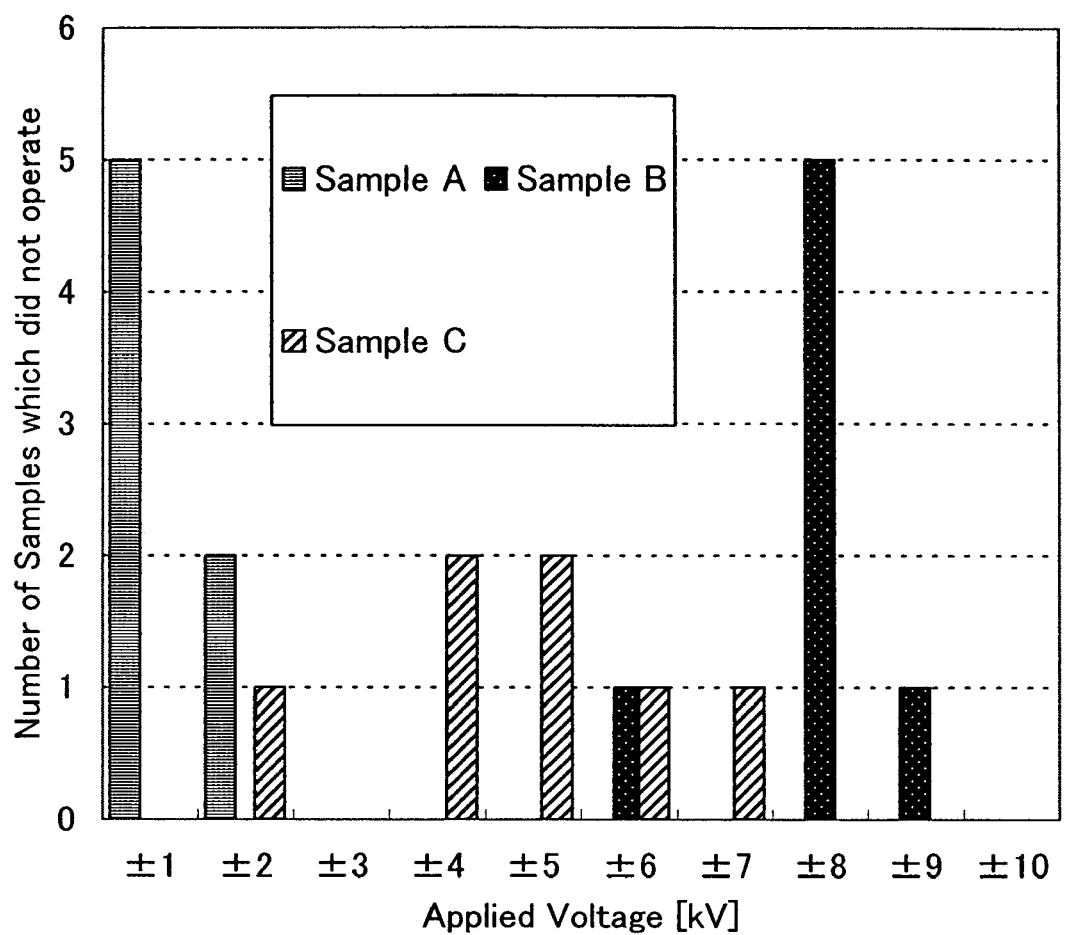
FIG. 7 illustrates the number of samples which did not operate with respect to applied voltage.

FIG. 7 illustrates the number of samples which did not operate with respect to applied voltage. All the samples A in which the antistatic film is not formed are in a non-operating state when a voltage of ±2 kV is applied. In contrast, operations of the samples B and the samples C in which the antistatic film is formed can be checked when a voltage of more than ±2 kV is applied. Particularly among the samples B, there are samples whose operation can be checked when a voltage of ±8 kV is applied. Accordingly, in the semiconductor device of the present invention, reduction in reliability due to electrostatic discharge can be prevented.

Embodiment Mode 3

The inventors examined the amount of charging in the semiconductor device of the present invention when friction treatment is performed.

In the test for the amount of charging, all samples have a structure in which an on-chip antenna and an integrated circuit are interposed between a pair of structure bodies each including a single-layer fiber body. The fiber body included in the structure body is plain-woven using the warp yarn and the weft yarn. A sample A is a sample in which an antistatic film is not formed. A sample B is a sample in which an antistatic film is formed on the side of each structure body, which does not face the on-chip antenna and the integrated circuit as in FIG. 1C, and siloxane-based oligomer (product name: COLCOAT, manufactured by COLCOAT CO., Ltd.) is used for the antistatic film. A sample C is a sample in which an antistatic film is formed on the side of each structure body, which faces the on-chip antenna and the integrated circuit as in FIG. 3A, and the siloxane-based oligomer (product name: COLCOAT, manufactured by COLCOAT CO., Ltd.) is used for the antistatic film. A sample D is a sample in which the structure body is interposed between two antistatic films as in FIG. 3C, a material used for the antistatic film is dispersed in an organic resin included in the structure body, and the siloxane-based oligomer (product name: COLCOAT, manufactured by COLCOAT CO., Ltd.) is used for the antistatic film.

Friction treatment was performed by rubbing a surface of the semiconductor device with cellulose nonwoven fabric (product name: BEMCOT (registered trademark) manufactured and distributed by OZU Corporation; material provided by Asahi Kasei Fibers Corporation).

In the test for the amount of charging in this embodiment mode, the amount of charging of the sample A was −582 V; the sample B, −1 V; the sample C, −455 V; and the sample D, −650 V. Accordingly, when the siloxane-based oligomer is used for the antistatic film, the antistatic film is formed on the side of each structure body, which does not face the on-chip antenna and the integrated circuit as in the sample B, and thus, an effect of reducing the amount of charging was achieved.

Embodiment Mode 4

The inventors examined the amount of charging in the semiconductor device of the present invention when friction treatment is performed.

In the test for the amount of charging, all samples have a structure in which an on-chip antenna and an integrated circuit are interposed between a pair of structure bodies each including a single-layer fiber body. The fiber body included in the structure body is plain-woven using the warp yarn and the weft yarn. A sample A is a sample in which an antistatic film is not formed. A sample B is a sample in which an antistatic film is formed on the side of each structure body, which does not face the on-chip antenna and the integrated circuit as in FIG. 1C, and the polythiophene-based conductive polymer (product name: CONISOL (registered trademark), manufactured by InsCon Tech Co., Ltd.) is used for the antistatic film. A sample C is a sample in which an antistatic film is formed on the side of each structure body, which faces the on-chip antenna and the integrated circuit as in FIG. 3A, and the polythiophene-based conductive polymer (product name: CONISOL (registered trademark), manufactured by InsCon Tech Co., Ltd.) is used for the antistatic film. A sample D is a sample in which the structure body is interposed between two antistatic films as in FIG. 3C, a material used for the antistatic film is dispersed in an organic resin included in the structure body, and the polythiophene-based conductive polymer (product name: CONISOL (registered trademark), manufactured by InsCon Tech Co., Ltd.) is used for the antistatic film.

Friction treatment was performed by rubbing a surface of the semiconductor device with the cellulose nonwoven fabric (product name: BEMCOT (registered trademark), manufactured and distributed by OZU Corporation; material provided by Asahi Kasei Fibers Corporation).

In the test for the amount of charging in this embodiment mode, the amount of charging of the sample A was −685 V; the sample B, +259 V; the sample C, −32 V; and the sample D, −40 V. Accordingly, when the polythiophene-based conductive polymer is used for the antistatic film, the antistatic film is formed on the side of each structure body, which faces the on-chip antenna and the integrated circuit as in the sample C, and thus, an effect of reducing the amount of charging was achieved. Moreover, when the polythiophene-based conductive polymer is used for the antistatic film, the structure body is interposed between the two antistatic films and the material used for the antistatic film is dispersed in the organic resin included in the structure body as in the sample D; thus, an effect of reducing the amount of charging was achieved.

Embodiment Mode 5

The inventors examined the amount of charging in the semiconductor device of the present invention when friction treatment is performed.

In the test for the amount of charging, all samples have a structure in which an on-chip antenna and an integrated circuit are interposed between a pair of structure bodies each including a single-layer fiber body. The fiber body included in the structure body is plain-woven using the warp yarn and the weft yarn. A sample A is a sample in which an antistatic film is not formed. A sample B is a sample in which an antistatic film is formed on the side of each structure body, which does not face the on-chip antenna and the integrated circuit as in FIG. 1C, and the cationic surfactant (product name: Staticide (registered trademark), manufactured by ACL Staticide Inc.) is used for the antistatic film. A sample C is a sample in which an antistatic film is formed on the side of each structure body, which faces the on-chip antenna and the integrated circuit as in FIG. 3A, and the cationic surfactant (product name: Staticide (registered trademark), manufactured by ACL Staticide Inc.) is used for the antistatic film. A sample D is a sample in which the structure body is interposed between two antistatic films as in FIG. 3C, a material used for the antistatic film is dispersed in an organic resin included in the structure body, and the cationic surfactant (product name: Staticide (registered trademark), manufactured by ACL Staticide Inc.) is used for the antistatic film.

Friction treatment was performed by rubbing a surface of the semiconductor device with the cellulose nonwoven fabric (product name: BEMCOT (registered trademark), manufactured and distributed by OZU Corporation; material provided by Asahi Kasei Fibers Corporation).

In the test for the amount of charging in this embodiment mode, the amount of charging of the sample A was −426 V; the sample B, −2 V; the sample C, +283 V; and the sample D, −491 V. Accordingly, when the cationic surfactant is used for the antistatic film, the antistatic film is formed on the side of each structure body, which does not face the on-chip antenna and the integrated circuit as in the sample B, and thus, an effect of reducing the amount of charging was achieved.

Embodiment Mode 6

In this embodiment mode, a method of manufacturing a semiconductor device of the present invention is described. Although this embodiment mode describes a thin film transistor (TFT) as an example of a semiconductor element, a semiconductor element used for the semiconductor device of the present invention is not limited thereto. For example, a memory element, a diode, a resistor, a capacitor, an inductor, or the like can be used as well as a TFT.

First, as shown in FIG. 8A, an insulating film 701, a separation layer 702, an insulating film 703, and a semiconductor film 704 are sequentially formed over a substrate 700 having heat resistance. The insulating film 701, the separation layer 702, the insulating film 703, and the semiconductor film 704 can be successively formed.

As the substrate 700, a glass substrate made of barium borosilicate glass, aluminoborosilicate glass, or the like, a quartz substrate, a ceramic substrate, or the like can be used. Alternatively, a metal substrate including a stainless steel substrate or a semiconductor substrate such as a silicon substrate may be used. A substrate formed from a synthetic resin having flexibility, such as plastic, generally tends to have lower allowable temperature limit than the above substrates; however, the substrate can be used as long as it can resist processing temperatures in the manufacturing process.

Examples of a plastic substrate include polyester typified by polyethylene terephthalate (PET), polyether sulfone (PES), polyethylene naphthalate (PEN), polycarbonate (PC), a polyamide synthetic fiber, polyetheretherketone (PEEK), polysulfone (PSF), polyetherimide (PEI), polyarylate (PAR), polybutylene terephthalate (PBT), polyimide, an acrylonitrile butadiene styrene resin, polyvinyl chloride, polypropylene, polyvinyl acetate, and an acrylic resin.

Although the separation layer 702 is provided over the entire surface of the substrate 700 in this embodiment mode, the present invention is not limited to this structure. For example, the separation layer 702 may be formed partly over the substrate 700 by a photolithography method or the like.

Each of the insulating films 701 and 703 is formed using an insulating material such as silicon oxide, silicon nitride (e.g., $SiN_x$ or $Si_3N_4$), silicon oxynitride ($SiO_xN_y$ where x>y>0), or silicon nitride oxide ($SiN_xO_y$ where x>y>0) by a CVD method, a sputtering method, or the like.

The insulating films 701 and 703 are provided to prevent alkali metal such as Na and alkaline earth metal which are contained in the substrate 700 from diffusing into the semiconductor film 704 and adversely affecting characteristics of semiconductor elements such as TFTs. Moreover, the insulating film 703 serves to prevent an impurity element contained in the separation layer 702 from diffusing into the semiconductor film 704, and also serves to protect the semiconductor elements in a later step of separating the semiconductor elements. Further, the insulating film 703 facilitates separation in the separation layer 702 or can prevent the semiconductor elements and wirings from being cracked or damaged in the later step of separating the semiconductor elements.

Each of the insulating films 701 and 703 can be a single insulating film or stacked layers of a plurality of insulating films. In this embodiment mode, the insulating film 703 is formed by sequentially stacking a silicon oxynitride film having a thickness of 100 nm, a silicon nitride oxide film having a thickness of 50 nm, and a silicon oxynitride film having a thickness of 100 nm. However, the material and the thickness of each film and the number of stacked films are not limited to this example. For example, the silicon oxynitride film in the lower layer may be replaced with a siloxane-based resin having a thickness of 0.5 to 3 μm that is formed by a spin coating method, a slit coating method, a droplet discharging method, a printing method, or the like. Moreover, the silicon nitride oxide film in the middle layer may be replaced with a silicon nitride film. Further, the silicon oxynitride film in the upper layer may be replaced with a silicon oxide film. The thickness of each film is preferably in the range of 0.05 to 3 μm, and can be freely selected within this range.

Alternatively, the lower layer of the insulating film 703, which is closest to the separation layer 702, may be formed using a silicon oxynitride film or a silicon oxide film, the middle layer thereof may be formed using a siloxane-based resin, and the upper layer thereof may be formed using a silicon oxide film.

Note that a siloxane-based resin is a resin formed from a siloxane-based material as a starting material and having the bond of Si—O—Si. A siloxane-based resin may contain at least one kind of fluorine, an alkyl group, and aromatic hydrocarbon, in addition to hydrogen as a substituent.

The silicon oxide film can be formed using a mixed gas such as $SiH_4/O_2$ or TEOS (tetraethoxysilane)/$O_2$ by a thermal CVD method, a plasma CVD method, an atmospheric pressure CVD method, a bias ECR-CVD method, or the like. The silicon nitride film can be typically formed using a mixed gas of $SiH_4$ and $NH_3$ by a plasma CVD method. The silicon oxynitride film and the silicon nitride oxide film can be typically formed using a mixed gas of $SiH_4$ and $N_2O$ by a plasma CVD method.

As the separation layer 702, a metal film, a metal oxide film, or a stacked-layer film of a metal film and a metal oxide film can be used. Each of the metal film and the metal oxide film may have a single-layer structure or a stacked-layer structure in which a plurality of layers are stacked. Further, metal nitride or metal oxynitride may be used other than the metal film and the metal oxide film. The separation layer 702 can be formed by a sputtering method or various CVD methods such as a plasma CVD method.

Examples of metals used for the separation layer 702 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir). The separation layer 702 may be a film made of an alloy containing any of the above-described metals as a main component or a film made of a compound containing any of the above-described metals other than a film formed from any of the above-described metals.

Alternatively, the separation layer 702 may be formed using a single silicon (Si) film or a film made of a compound containing silicon (Si) as a main component. Further alternatively, the separation layer 702 may be formed using a film made of an alloy of silicon (Si) and any of the above-described metals. A film containing silicon can have any of amorphous, microcrystalline, and polycrystalline structures.

The separation layer 702 can be a single layer of the above-described film or stacked layers of a plurality of the above-described films. The separation layer 702 in which a metal film and a metal oxide film are stacked can be formed by forming a base metal film and then oxidizing or nitriding a surface of the metal film. Specifically, plasma treatment may be performed on the base metal film in an oxygen atmosphere or an $N_2O$ atmosphere, or heat treatment may be performed on the metal film in an oxygen atmosphere or an $N_2O$ atmosphere. Alternatively, the metal film can be oxidized by forming a silicon oxide film or a silicon oxynitride film directly on the base metal film. In a similar manner, nitridation can be performed by forming a silicon nitride oxide film or a silicon nitride film directly on the base metal film.

As the plasma treatment for oxidation or nitridation of the metal film, high-density plasma treatment may be performed with a plasma density of $1\times10^{11}$ cm$^{-3}$ or higher, preferably $1\times10^{11}$ to $9\times10^{15}$ cm$^{-3}$, and with high frequency such as microwaves (e.g., a frequency of 2.45 GHz).

Although the separation layer 702 in which a metal film and a metal oxide film are stacked can be formed by oxidizing the surface of the base metal film, a metal oxide film may be separately formed after a metal film is formed. For example, when tungsten is used as a metal, a tungsten film is formed as a base metal film by a sputtering method, a CVD method, or the like, and then, plasma treatment is performed on the tungsten film. Accordingly, the tungsten film which is a metal film and a metal oxide film which is in contact with the metal film and is formed from oxide of tungsten can be formed.

The semiconductor film 704 is preferably formed without exposure to air after the insulating film 703 is formed. The thickness of the semiconductor film 704 is 20 to 200 nm (preferably 40 to 170 nm, and more preferably 50 to 150 nm). Note that the semiconductor film 704 may be an amorphous semiconductor, a semi-amorphous semiconductor (a microcrystalline semiconductor), or a polycrystalline semiconductor. Further, not only silicon but also silicon germanium can be used for the semiconductor. When silicon germanium is used, a concentration of germanium is preferably approximately 0.01 to 4.5 at. %.

Note that a semi-amorphous semiconductor film is a film containing a semiconductor with an intermediate structure between an amorphous semiconductor and a semiconductor having a crystal structure (including a single-crystal structure and a polycrystalline structure). The semi-amorphous semiconductor corresponds to a semiconductor having a third condition which is stable in terms of free energy and corresponds to a crystalline substance having a short-range order and lattice distortion. The semi-amorphous semiconductor having a crystal grain size of 0.5 to 20 nm can be dispersed in a non-single crystalline semiconductor. As for the semi-amorphous semiconductor, Raman spectrum thereof is shifted to a wave number side lower than 520 cm$^{-1}$, and the diffraction peaks of (111) and (220) which are said to be caused by a Si crystal lattice are observed in X-ray diffraction. Moreover, the semi-amorphous semiconductor film contains hydrogen or halogen of at least 1 at. % or more to terminate a dangling bond. Here, such a semiconductor is referred to as a semi-amorphous semiconductor (SAS) for convenience. Further, when a rare gas element such as helium, argon, krypton, or neon is included to further promote lattice distortion, stability is improved and thus an excellent semi-amorphous semiconductor can be obtained.

In addition, the SAS can be obtained by glow discharge decomposition of gas containing silicon. A typical example of gas containing silicon is $SiH_4$, and $Si_2H_6$, $SiH_2Cl_2$, $SiHCl_3$, $SiCl_4$, $SiF_4$, or the like may be used as well. When the gas containing silicon is diluted with hydrogen, or gas in which one or more rare gas elements such as helium, argon, krypton, and neon are added to hydrogen, the SAS can be easily formed. It is preferable to use a dilution ratio of 2 to 1000 times to dilute the gas containing silicon. Further, a carbide gas such as $CH_4$ or $C_2H_6$, a germanium gas such as $GeH_4$ or $GeF_4$, $F_2$, or the like may be mixed in the gas containing silicon to adjust an energy band width to be 1.5 to 2.4 eV or 0.9 to 1.1 eV.

For example, in the case of using a gas in which $H_2$ is added to $SiH_4$ or a gas in which $F_2$ is added to $SiH_4$, when a TFT is manufactured using the semi-amorphous semiconductor, a subthreshold coefficient (subthreshold swing) of the TFT can be 0.35 V/dec or less, typically 0.25 to 0.09 V/dec, and a mobility can be 10 cm$^2$/Vsec.

Note that the semiconductor film 704 may be crystallized by a known technique. As a known crystallization method, there are a laser crystallization method with laser light and a crystallization method with a catalytic element. Alternatively, it is also possible to combine a crystallization method with a catalytic element and a laser crystallization method. When a heat-resistant substrate such as quartz is used for the substrate 700, it is possible to combine any of the following crystallization methods: a thermal crystallization method with an electrically heated furnace, a lamp anneal crystallization method with infrared light, a crystallization method with a catalytic element, and high temperature annealing at approximately 950° C.

For example, when laser crystallization is used, heat treatment at 550° C. is applied to the semiconductor film 704 for four hours before the laser crystallization, in order to enhance the resistance of the semiconductor film 704 to a laser. Then, a continuous-wave solid-state laser is used and irradiation is performed with the second to fourth harmonics of the fundamental wave, whereby crystals with a large grain size can be obtained. Typically, the second harmonic (532 nm) or the third harmonic (355 nm) of an Nd:YVO$_4$ laser (the fundamental wave of 1064 nm) is preferably used, for example. Specifically, laser light emitted from a continuous-wave YVO$_4$ laser is converted into a harmonic with a nonlinear optical element, so that laser light having an output power of 10 W is obtained. Then, the laser beam is preferably shaped into a rectangular shape or an elliptical shape with an optical system on the irradiation surface, so that the semiconductor film 704 is irradiated with the laser light. In this case, a laser power density of approximately 0.01 to 100 MW/cm$^2$ (preferably 0.1 to 10 MW/cm$^2$) is needed, and irradiation is performed with a scanning rate of approximately 10 to 2000 cm/sec.

As a continuous-wave gas laser, an Ar laser, a Kr laser, or the like can be used. As a continuous-wave solid-state laser, the following can be used: a YAG laser, a YVO$_4$ laser, a YLF laser, a YAlO$_3$ laser, a forsterite (Mg$_2$SiO$_4$) laser, a GdVO$_4$ laser, a Y$_2$O$_3$ laser, a glass laser, a ruby laser, an alexandrite laser, a Ti:sapphire laser, and the like.

Alternatively, the following pulsed lasers can be used, for example: an Ar laser, a Kr laser, an excimer laser, a CO$_2$ laser, a YAG laser, a Y$_2$O$_3$ laser, a YVO$_4$ laser, a YLF laser, a YAlO$_3$ laser, a glass laser, a ruby laser, an alexandrite laser, a Ti:sapphire laser, a copper vapor laser, and a gold vapor laser.

A repetition rate of pulsed laser light may be set at 10 MHz or higher, so that laser crystallization may be performed with a considerably higher frequency band than the normally used frequency band of several ten to several hundred Hz. It is said that it takes several ten to several hundred nsec for the semiconductor film 704 to be completely solidified after the semiconductor film 704 is melted by irradiation with pulsed laser light. Accordingly, by using the above-described frequency, the semiconductor film 704 can be irradiated with the next pulsed laser light after it is melted by the pulsed laser beam and before it becomes solidified. Thus, the solid-liquid interface of the semiconductor film 704 can be moved continuously, so that the semiconductor film 704 having crystal grains that have grown continuously in the scanning direction is formed. Specifically, it is possible to form an aggregation of crystal grains each having a width of about 10 to 30 μm in the scanning direction and a width of about 1 to 5 μm in the a direction perpendicular to the scanning direction. By forming single crystal grains that have continuously grown in the scanning direction, it is possible to form the semiconductor film 704 having few crystal grain boundaries at least in the channel direction of a TFT.

Note that laser crystallization can be performed by irradiation with a fundamental wave of continuous-wave laser light and a harmonic of continuous-wave laser light in parallel. Alternatively, laser crystallization may be performed by irradiation with a fundamental wave of continuous-wave laser light and a harmonic of pulsed laser light in parallel.

In addition, laser irradiation may be performed in an inert gas atmosphere such as a rare gas or nitrogen. Accordingly, roughness of the semiconductor surface by laser irradiation can be suppressed, and variation in threshold values resulting from a variation in interface state density can be suppressed.

By the above-described laser light irradiation, the semiconductor film 704 with enhanced crystallinity can be formed. Note that a polycrystalline semiconductor which is formed by a sputtering method, a plasma CVD method, a thermal CVD method, or the like may be used for the semiconductor film 704.

Although the semiconductor film 704 is crystallized in this embodiment mode, it can remain as an amorphous silicon film or a microcrystalline semiconductor film without being crystallized and proceed to the following process. A TFT formed using an amorphous semiconductor or a microcrystalline semiconductor involves fewer manufacturing steps than a TFT formed using a polycrystalline semiconductor; thus, it has advantages of low cost and high yield.

The amorphous semiconductor can be obtained by glow discharge decomposition of a gas containing silicon. Examples of the gas containing silicon include SiH$_4$ and Si$_2$H$_6$. The gas containing silicon may be used by being diluted with hydrogen, or hydrogen and helium.

Next, channel doping is performed to add an impurity element imparting p-type conductivity or an impurity element imparting n-type conductivity at a low concentration to the semiconductor film 704. Channel doping may be performed on the entire semiconductor film 704 or a part of the semiconductor film 704 as selected. As the impurity element imparting p-type conductivity, boron (B), aluminum (Al), gallium (Ga), or the like can be used. As the impurity element imparting n-type conductivity, phosphorus (P), arsenic (As), or the like can be used. Here, boron (B) is used as the impurity element and added in such a manner that boron is contained at a concentration of $1\times10^{16}$ to $5\times10^{17}$/cm$^3$.

Next, as shown in FIG. 8B, the semiconductor film 704 is processed (patterned) to have predetermined shapes, so that island-shaped semiconductor films 705 and 706 are formed. Then, as shown in FIG. 8C, semiconductor elements using the island-shaped semiconductor films 705 and 706 and a conductor 714 used as an on-chip antenna are formed. In this embodiment mode, an example in which TFTs 710 and 711 are formed as the semiconductor elements used in an integrated circuit is described. An integrated circuit including the semiconductor elements, a wiring, and the like which are formed over the insulating film 703 corresponds to an element layer 715. The element layer 715 may include the insulating film 703. The conductor 714 used as the on-chip antenna is formed over the element layer 715.

The conductor 714 used as the on-chip antenna can be formed using metal such as silver (Ag), gold (Au), copper (Cu), palladium (Pd), chromium (Cr), platinum (Pt), molybdenum (Mo), titanium (Ti), tantalum (Ta), tungsten (W), aluminum (Al), iron (Fe), cobalt (Co), zinc (Zn), tin (Sn), or nickel (Ni). As the conductor 714 used as the on-chip antenna, a film made of an alloy containing the above-described metal as a main component or a compound containing the above-described metal may be used as well as the film formed from the above-described metal. The conductor 714 used as the on-chip antenna can be formed of a single layer of the above-described film or stacked layers of a plurality of the above-described films.

The conductor 714 used as the on-chip antenna can be formed by a CVD method, a sputtering method, a printing method such as screen printing or gravure printing, a droplet discharging method, a dispensing method, a plating method, a photolithography method, an evaporation method, a sputtering method, or the like.

When a sputtering method is used, a mask may be deposited between a target and the substrate 700 to form the conductor 714. Alternatively, a conductive film may be formed and then patterned by etching to form the conductor 714. When etching is performed, wet etching or dry etching is performed using a mask made of a resist or the like. By using a sputtering method, the thickness of the conductor 714 can be 0.3 to 5 μm, preferably 0.5 to 2 μm.

For example, when a screen printing method is used, the conductor 714 used as the on-chip antenna can be formed by selectively printing a conductive paste in which conductive particles each having a particle size of several nm to several ten μm are dispersed in an organic resin onto the insulating film. The conductive particles can be formed using silver (Ag), gold (Au), copper (Cu), nickel (Ni), platinum (Pt), palladium (Pd), tantalum (Ta), molybdenum (Mo), tin (Sn), lead (Pb), zinc (Zn), chromium (Cr), titanium (Ti), or the like. Instead of such a metal, the conductive particles may be formed using an alloy containing the above-described metal as a main component or a compound containing the above-described metal. Alternatively, fine particles of silver halide or dispersible nanoparticles may be used. Further, as the organic resin contained in the conductive paste, polyimide, a siloxane-based resin, an epoxy resin, a silicone resin, or the like can be used.

As examples of an alloy of the above-described metals, the following combinations can be given: silver (Ag) and palladium (Pd), silver (Ag) and platinum (Pt), gold (Au) and platinum (Pt), gold (Au) and palladium (Pd), and silver (Ag) and copper (Cu). Alternatively, conductive particles of copper (Cu) coated with silver (Ag) can be used, for example.

Note that when the conductor 714 used as the on-chip antenna is formed, it is preferable that a conductive paste be applied by a printing method or a droplet discharging method, and then baked. For example, when conductive particles (e.g., a particle size of 1 to 100 nm) containing silver as a main component are used for the conductive paste, an antistatic film functioning as an antenna can be formed by baking the conductive paste at a temperature of 150 to 300° C. Baking may be performed by lamp annealing with an infrared lamp, a xenon lamp, a halogen lamp, or the like, or by furnace annealing with an electric furnace. Alternatively, a laser annealing method with an excimer laser or an Nd:YAG laser may be used. Further alternatively, fine particles containing solder or lead-free solder as a main component may be used; in that case, it is preferable to use fine particles each having a particle size of 20 µm or less. Solder and lead-free solder have an advantage of low cost.

When a printing method or a droplet discharging method is used, the conductor 714 used as the on-chip antenna can be formed without using a mask for light exposure. Moreover, when a droplet discharging method or a printing method is used, waste of a material which would be removed by etching can be avoided unlike in the case of a photolithography method. Further, since an expensive mask for light exposure does not have to be used, costs for manufacturing a semiconductor device can be reduced.

Next, as shown in FIG. 9A, a structure body 725 in which a fiber body 723 is impregnated with an organic resin 724 is superposed on the side of the element layer 715, which does not face the substrate 700. Such a structure body 725 is also referred to as a prepreg. A prepreg is specifically formed in the following manner: a fiber body is impregnated with a varnish in which a matrix resin is diluted with an organic solvent, and thereafter, drying is performed so that the organic solvent is volatilized and the matrix resin is semi-cured. The thickness of the structure body 725 is preferably 10 to 100 µm, more preferably 10 to 30 µm. When a structure body with such a thickness is used, a thin semiconductor device capable of being bent can be manufactured.

In this embodiment mode, the structure body 725 in which a single-layer fiber body is impregnated with an organic resin is used; however, the present invention is not limited to this structure. A structure body may be used in which a stack of a plurality of fiber bodies is impregnated with an organic resin. Further, when a plurality of structure bodies in each of which a single-layer fiber body is impregnated with an organic resin are stacked, another layer may be interposed between the structure bodies.

Next, the structure body 725 is heated and subjected to pressure bonding so that the organic resin 724 of the structure body 725 is plasticized or cured. When the organic resin 724 is an organic plastic resin, the organic resin which is plasticized is then cured by cooling the organic resin to room temperature. By heating and pressure bonding, the organic resin 724 is uniformly spread so as to be in close contact with the element layer 715, and is cured. The step in which the structure body 725 is subjected to pressure bonding is performed under an atmospheric pressure or a reduced pressure.

Then, as shown in FIG. 9B, the element layer 715, the conductor 714, and the structure body 725 are separated from the substrate 700. In this embodiment mode, the element layer 715, the conductor 714, and the structure body 725 are separated from the substrate 700 by using physical force. The separation layer 702 may partially remain without being entirely removed. The separation can be performed by pulling by a human hand or a gripping tool, or separating while rolling a roller.

Although a method in which a metal oxide film is used for the separation layer and the element layer 715 and the conductor 714 are separated using a physical means is used in this embodiment mode, a separation method used for the present invention is not limited thereto. For example, a method may be used in which a light-transmitting substrate 700 is used, amorphous silicon containing hydrogen is used for the separation layer 702, and the separation layer 702 is irradiated with a laser beam from the substrate 700 side to vaporize hydrogen contained in the amorphous silicon, so that the substrate 700 is separated from the element layer 715.

Alternatively, the separation may be performed by a method of using etching of the separation layer 702. In this case, a trench is formed so as to partly expose the separation layer 702. The trench is formed by dicing, scribing, processing using a laser beam including UV light, a photolithography method, or the like. The trench may be deep enough to expose the separation layer 702. Further, halogen fluoride is used as an etching gas, and the gas is introduced through the trench. In this embodiment mode, etching is performed under the conditions of, for example, using $ClF_3$ (chlorine trifluoride), a temperature of 350° C., a flow rate of 300 sccm, an atmospheric pressure of 800 Pa, and a period of three hours. Alternatively, nitrogen may be mixed into the $ClF_3$ gas. When halogen fluoride such as $ClF_3$ is used, the separation layer 702 can be selectively etched, and the substrate 700 can be separated from the element layer 715. Note that halogen fluoride may be either gas or liquid.

Alternatively, by a method in which a substrate is removed by mechanical polishing or a method in which a substrate is removed by dissolution of the substrate with a solution such as HF, the element layer 715 can be separated from the substrate 700. In this case, the separation layer 702 is not necessarily used.

Figure 10A:
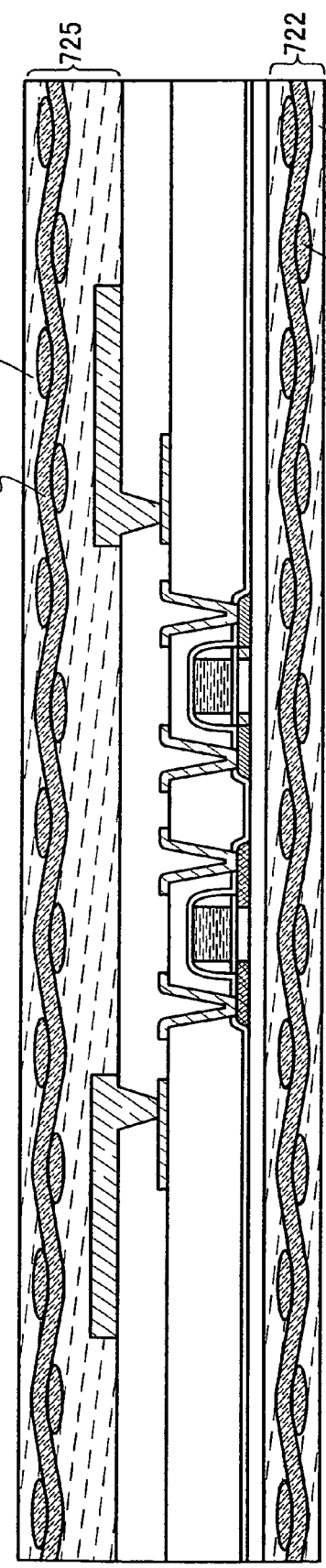
FIGS. 10A and 10B illustrate a method of manufacturing a semiconductor device of the present invention.

Next, as shown in FIG. 10A, a structure body 722 in which a fiber body 720 is impregnated with an organic resin 721 is superposed on the side of the element layer 715, which is exposed by the above-described separation. Such a structure body 722 is also referred to as a prepreg. A prepreg is specifically formed in the following manner: a fiber body is impregnated with a varnish in which a matrix resin is diluted with an organic solvent, and thereafter, drying is performed so that the organic solvent is volatilized and the matrix resin is semi-cured. The thickness of the structure body 722 is preferably 10 to 100 µm, more preferably 10 to 30 µm. When a structure body with such a thickness is used, a thin semiconductor device capable of being bent can be manufactured.

In this embodiment mode, the structure body 722 in which a single-layer fiber body is impregnated with an organic resin is used; however, the present invention is not limited to this structure. The structure body 722 in which a stack of a plurality of fiber bodies is impregnated with an organic resin may be used. Further, when a plurality of structure bodies in each of which a single-layer fiber body is impregnated with an organic resin are stacked, another layer may be interposed between the structure bodies.

Next, the structure body 722 is heated and subjected to pressure bonding so that the organic resin 721 of the structure body 722 is plasticized or cured. When the organic resin 721 is an organic plastic resin, the organic resin which is plasticized is then cured by cooling the organic resin to room temperature. By heating and pressure bonding, the organic resin 721 is uniformly spread so as to be in close contact with the element layer 715, and is cured. The step in which the structure body 722 is subjected to pressure bonding is performed under an atmospheric pressure or a reduced pressure.

Figure 10B:
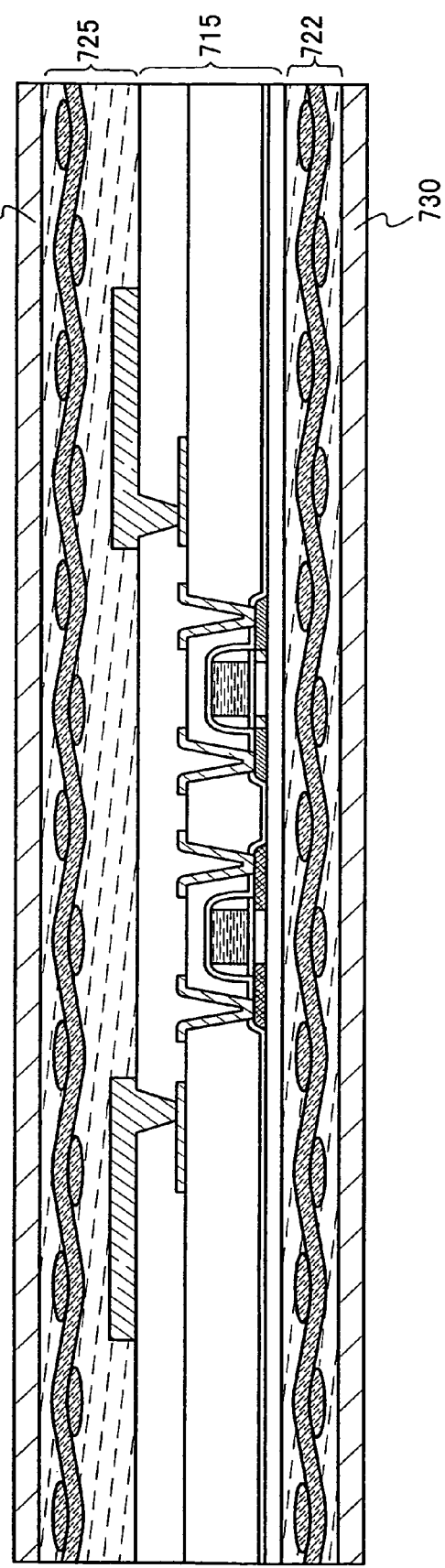

Next, as shown in FIG. 10B, an antistatic film 730 and an antistatic film 731 are formed in surfaces of the structure body 722 and the structure body 725 respectively, which do not face the element layer 715. Each of the antistatic films 730 and 731 has conductivity and a surface resistance value of approximately $10^6$ to $10^{14}$ $\Omega/cm^2$. For the antistatic films 730 and 731, a surfactant, a conductive polymer, a resin in which conductive particles such as carbon black or silver are dispersed, a siloxane-based resin, a siloxane-based material, or the like can be used. Specific examples of the surfactant include a nonionic surfactant such as glycerin fatty acid ester, polyoxyethylene alkyl ether, polyoxyethylene alkyl phenyl ether, N,N-bis(2-hydroxyethyl)alkylamine, N-2-hydroxyethyl-N-2-hydroxyalkylamine, polyoxyethylene alkylamine, polyoxyethylene alkylamine fatty acid ester, and alkyl diethanolamide; an anionic surfactant such as alkyl sulfonate, alkyl benzene sulfonate, and alkyl phosphate; a cationic surfactant such as tetraalkylammonium salt and trialkylbenzylammonium salt; and an amphoteric surfactant such as alkyl betaine and alkyl imidazolium betaine. When the surfactant is used, the thickness of each of the antistatic films 730 and 731 is preferably approximately 0.01 to 1 µm. Examples of the conductive polymer include polypyrrole-based and polythiophene-based polymers.

When a siloxane-based resin is used, the antistatic films 730 and 731 can be formed in the following manner. A liquid obtained by dissolving or dispersing a siloxane-based resin or a siloxane-based material in alcohol such as isopropyl alcohol, ethanol, propanol, or butanol is applied to the structure bodies 722 and 725 by a method such as dipping, spray coating, wiping with cloth, gravure coating, roll coating, or printing, and dried or baked after being dried.

Note that an example in which the antistatic films 730 and 731 are formed on the surfaces of the structure bodies 722 and 725 respectively, which do not face the element layer 715, is described in this embodiment mode; however, the present invention is not limited to this structure. When the antistatic films 730 and 731 are formed on surfaces of the structure bodies 722 and 725 respectively, which are on the element layer 715 side, the antistatic films 730 and 731 are preferably formed before the structure bodies 722 and 725 are attached to the element layer 715. In this case also, the conductive antistatic film 731 having a surface resistance value of approximately $10^6$ to $10^{14}$ $\Omega/cm^2$ is used in the present invention; thus, a function of the on-chip antenna is not damaged even if the conductor 714 used as the on-chip antenna and the antistatic film 731 are in direct contact with each other.

When semiconductor elements forming a plurality of semiconductor devices are formed between the structure bodies 722 and 725, the element layer 715 is cut so that each semiconductor device is separated. The element layer 715 can be cut using a laser irradiation device, a dicing device, a scribing device, a cutting device having an edged tool such as scissors or a knife, or the like. When a laser irradiation device is used, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG GdVO$_4$, YVO$_4$, YLF, or YAlO$_3$ which are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that a fundamental wave to a fifth harmonic are preferably used in a solid-state laser as appropriate.

Figure 11:
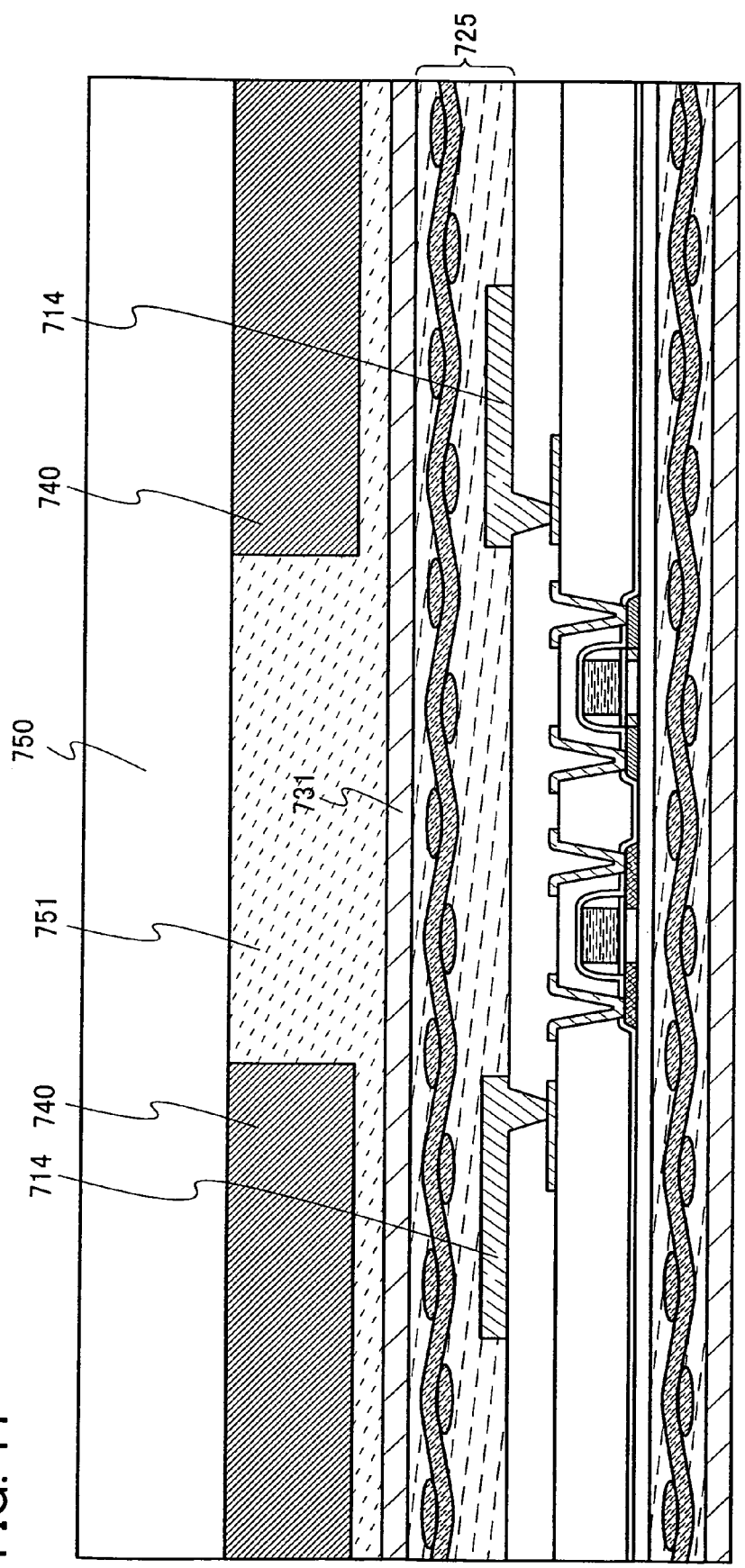
FIG. 11 illustrates a method of manufacturing a semiconductor device of the present invention.

Next, as shown in FIG. 11, a booster antenna 740 is attached on the side opposite to the conductor 714 used as the on-chip antenna with the structure body 725 interposed therebetween. In FIG. 11, the booster antenna 740 formed over a supporting substrate 750 is attached to the structure body 725 using an adhesive 751 with the antistatic film 731 interposed therebetween. Note that although the supporting substrate 750 is used in FIG. 11, the booster antenna 740 may be attached over the structure body 725 without using the supporting substrate 750.

Further, the booster antenna 740 is attached on the side opposite to the conductor 714 used as the on-chip antenna with the structure body 725 interposed therebetween in FIG. 11; however, the present invention is not limited to this structure. As shown in FIG. 12, the booster antenna 740 may be attached on the side opposite to the conductor 714 used as the on-chip antenna with the structure body 722 interposed therebetween.

Note that examples of a thin film transistor are described in this embodiment mode; however, the present invention is not limited to this structure. A transistor formed using an SOI or the like can be used as well as a thin film transistor. Moreover, a transistor using an organic semiconductor or a carbon nanotube can be used.

According to the present invention, a highly reliable semiconductor device which is not likely to be damaged by external force, in particular, pressing force and can prevent electrostatic discharge can be provided.

This embodiment mode can be implemented in combination with other embodiment modes and embodiments as appropriate.

Embodiment Mode 7

In this embodiment mode, a method of manufacturing a semiconductor device of the present invention is described, in which a semiconductor element is formed using a semiconductor film transferred from a semiconductor substrate (a bond substrate) to a supporting substrate (a base substrate) and the semiconductor element is transferred to a structure body.

Figure 13A:
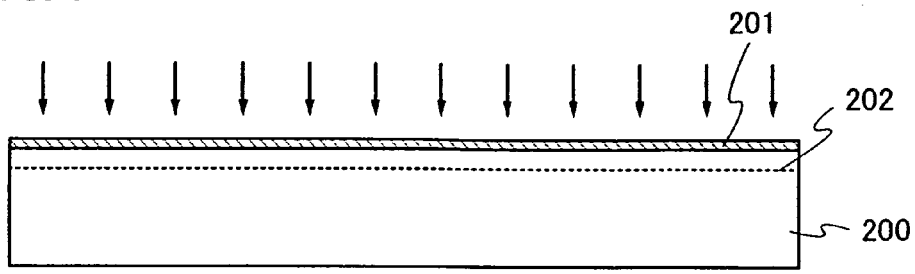
FIGS. 13A to 13D illustrate a method of manufacturing a semiconductor device of the present invention.

First, as shown in FIG. 13A, an insulating film 201 is formed over a bond substrate 200. As the bond substrate 200, any of the following substrates can be used: a single-crystal semiconductor substrate or a polycrystalline semiconductor substrate of silicon, germanium, or the like; or a single-crystal semiconductor substrate or a polycrystalline semiconductor substrate formed using a compound semiconductor such as gallium arsenide or indium phosphide. Alternatively, as the bond substrate 200, a substrate formed from silicon having lattice distortion, silicon germanium in which germanium is added to silicon, or the like may be used. Silicon having lattice distortion can be formed by film formation on silicon germanium or silicon nitride, which has a larger lattice constant than silicon.

The insulating film 201 is formed using an insulating material such as silicon oxide, silicon nitride oxide, silicon oxynitride, or silicon nitride. The insulating film 201 may be a single insulating film or stacked layers of a plurality of insulating films. For example, in this embodiment mode, the insulating film 201 is formed in which silicon oxynitride containing a larger amount of oxygen than nitrogen and silicon nitride oxide containing a larger amount of nitrogen than oxygen are stacked in this order from the side near the bond substrate 200.

For example, when silicon oxide is used for the insulating film 201, the insulating film 201 can be formed using a mixed gas of silane and oxygen, a mixed gas of TEOS (tetraethoxysilane) and oxygen, or the like by a vapor deposition method such as a thermal CVD method, a plasma CVD method, an atmospheric pressure CVD method, or a bias ECR-CVD method. In this case, a surface of the insulating film 201 may be densified with oxygen plasma treatment. Further, when silicon nitride is used for the insulating film 201, the insulating film 201 can be formed using a mixed gas of silane and ammonia by a vapor deposition method such as a plasma CVD method. When silicon nitride oxide or silicon oxynitride is used for the insulating film 201, the insulating film 201 can be formed using a mixed gas of silane and ammonia or a mixed gas of silane and silicon oxide by a vapor deposition method such as a plasma CVD method.

Alternatively, the insulating film 201 may be formed using silicon oxide which is formed using an organosilane gas by a chemical vapor deposition method. As the organosilane gas, a silicon-containing compound such as ethyl silicate (TEOS: $Si(OC_2H_5)_4$), tetramethylsilane (TMS: $Si(CH_3)_4$), tetramethylcyclotetrasiloxane (TMCTS), octamethylcyclotetrasiloxane (OMCTS), hexamethyldisilazane (HMDS), triethoxysilane ($SiH(OC_2H_5)_3$), or trisdimethyaminosilane ($SiH(N(CH_3)_2)_3$) can be used.

Next, as shown in FIG. 13A, hydrogen or a rare gas, or hydrogen ions or rare gas ions is/are added to the bond substrate 200 as indicated by arrows, whereby a weakened layer 202 having microvoids is formed in a region at a certain depth from a surface of the bond substrate 200. The position where the weakened layer 202 is formed is determined depending on acceleration voltage at the time of the addition. The thickness of a semiconductor film 208 which is transferred from the bond substrate 200 to a base substrate 204 is determined depending on the position of the weakened layer 202. Accordingly, acceleration of the voltage at the time of the addition is determined in consideration of the thickness of the semiconductor film 208. The thickness of the semiconductor film 208 is 10 to 200 nm, preferably 10 to 50 nm. For example, when hydrogen is added to the bond substrate 200, a dose is preferably from $1 \times 10^{16}$ to $1 \times 10^{17}/cm^2$.

Note that in the above-described step of forming the weakened layer 202, hydrogen or a rare gas, or hydrogen ions or rare gas ions is/are added to the bond substrate 200 at high concentration, and accordingly, a surface of the bond substrate 200 becomes rough and sufficient strength for bonding with the base substrate 204 cannot be obtained in some cases. By provision of the insulating film 201, the surface of the bond substrate 200 is protected at the time of the addition of hydrogen or a rare gas, or hydrogen ions or rare gas ions, and the base substrate 204 and the bond substrate 200 can be favorably bonded to each other.

Figure 13B:
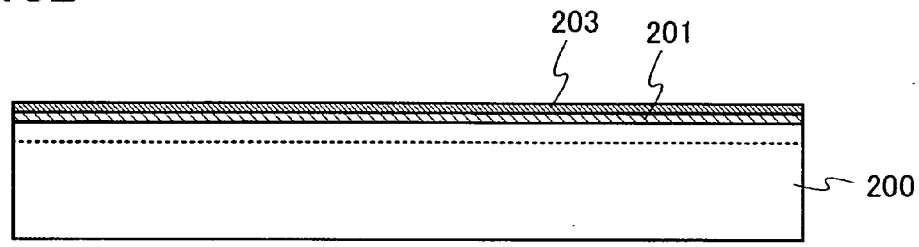

Next, as shown in FIG. 13B, an insulating film 203 is formed over the insulating film 201. The insulating film 203 is formed using an insulating material such as silicon oxide, silicon nitride oxide, silicon oxynitride, or silicon nitride in a similar manner to the insulating film 201. The insulating film 203 may be formed using a single insulating film or stacked layers of a plurality of insulating films. Alternatively, silicon oxide formed using an organosilane gas by a chemical vapor deposition method may be used for the insulating film 203. In this embodiment mode, silicon oxide formed using an organosilane gas by a chemical vapor deposition method is used for the insulating film 203.

When an insulating film having a high barrier property, such as silicon nitride or silicon nitride oxide, is used for the insulating film 201 or the insulating film 203, impurities such as alkali metal or alkaline earth metal can be prevented from entering a semiconductor film 209, which is formed later, from the base substrate 204.

Note that although the insulating film 203 is formed after the weakened layer 202 is formed in this embodiment mode, the insulating film 203 is not necessarily provided. However, the insulating film 203 is formed after the weakened layer 202 is formed, and thus, a surface of the insulating film 203 has higher planarity than that of the insulating film 201 which is formed before the formation of the weakened layer 202. Accordingly, strength of bonding which is performed in a later step can be increased by the formation of the insulating film 203.

Figure 13C:
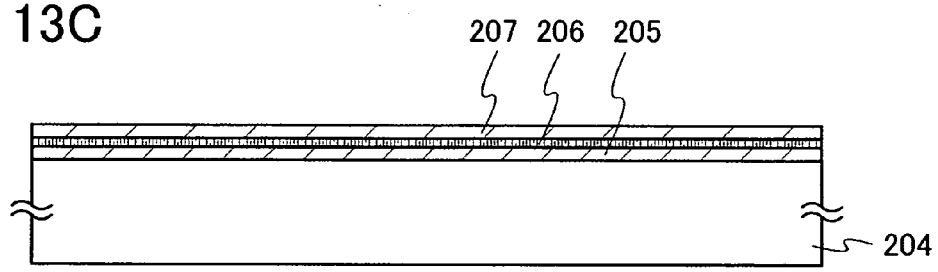

Meanwhile, as shown in FIG. 13C, an insulating film 205, a separation layer 206, and an insulating film 207 are sequentially formed over the base substrate 204.

The insulating films 205 and 207 are each formed using an insulating material such as silicon oxide, silicon nitride (e.g., $SiN_x$ or $Si_3N_4$), silicon oxynitride ($SiO_xN_y$, where x>y>0), or silicon nitride oxide ($SiN_xO_y$, where x>y>0) by a CVD method, a sputtering method, or the like.

The insulating films 205 and 207 are provided to prevent alkali metal such as Na and alkaline earth metal which are contained in the base substrate 204 from diffusing into the semiconductor film 209, which is formed in a later step, and adversely affecting characteristics of semiconductor elements. Moreover, the insulating film 207 can prevent an impurity element contained in the separation layer 206 from diffusing into the semiconductor elements, and can prevent the semiconductor elements and wirings from being cracked or damaged in a later step of separating the semiconductor elements.

Each of the insulating films 205 and 207 can be a single insulating film or stacked layers of a plurality of insulating films. In this embodiment mode, the insulating film 207 is formed by sequentially stacking a silicon oxynitride film having a thickness of 100 nm, a silicon nitride oxide film having a thickness of 50 nm, and a silicon oxynitride film having a thickness of 100 nm. However, the material and the thickness of each film as well as the number of stacked films are not limited to those of this example. For example, the silicon oxynitride film in the lower layer may be replaced with a siloxane-based resin having a thickness of 0.5 to 3 μm that is formed by a spin coating method, a slit coating method, a droplet discharging method, a printing method, or the like. Moreover, the silicon nitride oxide film in the middle layer may be replaced with a silicon nitride film. Further, the silicon oxynitride film in the upper layer may be replaced with a silicon oxide film. A thickness of each film is preferably 0.05 to 3 μm, and can be freely selected within this range.

Alternatively, the lower layer of the insulating film 207, which is closest to the separation layer 206, may be formed using a silicon oxynitride film or a silicon oxide film, the middle layer thereof may be formed using a siloxane-based resin, and the upper layer thereof may be formed using a silicon oxide film.

Note that a siloxane-based resin is a resin formed from a siloxane-based material as a starting material and having the bond of Si—O—Si. A siloxane-based resin may contain at least one kind of fluorine, an alkyl group, and aromatic hydrocarbon, in addition to hydrogen as a substituent.

The silicon oxide film can be formed using a mixed gas such as $SiH_4/O_2$ or TEOS (tetraethoxysilane)/$O_2$ by a thermal CVD method, a plasma CVD method, an atmospheric pressure CVD method, a bias ECR-CVD method, or the like. The silicon nitride film can be typically formed using a mixed gas of $SiH_4$ and $NH_3$ by a plasma CVD method. The silicon oxynitride film and the silicon nitride oxide film can be typically formed using a mixed gas of $SiH_4$ and $N_2O$ by a plasma CVD method.

As the separation layer 206, a metal film, a metal oxide film, or a stacked-layer film of a metal film and a metal oxide film can be used. Each of the metal film and the metal oxide film may have a single-layer structure or a stacked-layer structure in which a plurality of layers are stacked. Further, metal nitride or metal oxynitride may be used other than the metal film and the metal oxynitride film. The separation layer 206 can be formed by a sputtering method or various CVD methods such as a plasma CVD method.

Examples of metals used for the separation layer 206 include tungsten (W), molybdenum (Mo), titanium (Ti), tantalum (Ta), niobium (Nb), nickel (Ni), cobalt (Co), zirconium (Zr), zinc (Zn), ruthenium (Ru), rhodium (Rh), palladium (Pd), osmium (Os), and iridium (Ir). The separation layer 206 may be a film made of an alloy containing any of the above-described metals as a main component or a film made of a compound containing any of the above-described metals other than a film formed from any of the above-described metals.

Alternatively, the separation layer 206 may be formed using a single silicon (Si) film or a film made of a compound containing silicon (Si) as a main component. Further alternatively, the separation layer 206 may be formed using a film made of an alloy of silicon (Si) and any of the above-described metals. A film containing silicon can have any of amorphous, microcrystalline, and polycrystalline structures.

The separation layer 206 can be a single layer of the above-described film or stacked layers of a plurality of the above-described films. The separation layer 206 in which a metal film and a metal oxide film are stacked can be formed by forming a base metal film and then oxidizing or nitriding a surface of the metal film. Specifically, plasma treatment may be performed on the base metal film in an oxygen atmosphere or an $N_2O$ atmosphere, or heat treatment may be performed for the metal film in an oxygen atmosphere or an $N_2O$ atmosphere. Alternatively, the metal film can be oxidized by forming a silicon oxide film or a silicon oxynitride film directly on the base metal film. In a similar manner, nitridation can be performed by forming a silicon nitride oxide film or a silicon nitride film directly on the base metal film.

As the plasma treatment for oxidation or nitridation of the metal film, high-density plasma treatment may be performed with a plasma density of $1 \times 10^{11}$ $cm^{-3}$ or higher, preferably $1 \times 10^{11}$ to $9 \times 10^{15}$ $cm^{-3}$, and with high frequency such as microwaves (e.g., a frequency of 2.45 GHz).

Although the separation layer 206 in which a metal film and a metal oxide film are stacked can be formed by oxidizing the surface of the base metal film, a metal oxide film may be separately formed after a metal film is formed. For example, when tungsten is used as a metal, a tungsten film is formed as a base metal film by a sputtering method, a CVD method, or the like, and then, plasma treatment is performed on the tungsten film. Accordingly, the tungsten film which is a metal film and a metal oxide film which is in contact with the metal film and is formed from oxide of tungsten can be formed.

Next, the bond substrate 200 may be hydrogenated before the bond substrate 200 and the base substrate 204 are attached to each other by bonding. The hydrogenation treatment is performed, for example, at 350° C. in a hydrogen atmosphere for approximately two hours.

Figure 13D:
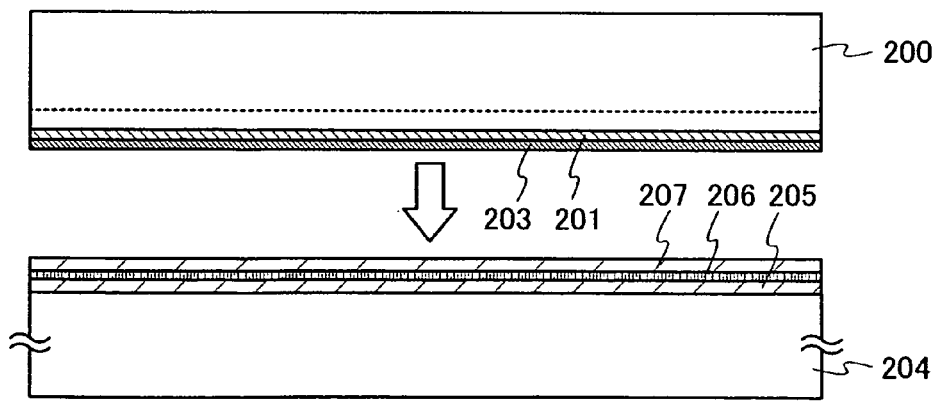

Then, as shown in FIG. 13D, the bond substrate 200 and the base substrate 204 are attached to each other so that the insulating films 203 and 207 are interposed therebetween. The insulating film 203 and the insulating film 207 are bonded to each other, whereby the bond substrate 200 and the base substrate 204 can be attached to each other.

Bonding is formed by van der Waals forces, so that firm bonding is formed even at room temperature. Note that since the above-described bonding can be performed at low temperature, a variety of substrates can be used as the base substrate 204. As the base substrate 204, for example, a glass substrate made of aluminosilicate glass, barium borosilicate glass, aluminoborosilicate glass, or the like; a substrate such as a quartz substrate or a sapphire substrate; a semiconductor substrate formed from silicon, gallium arsenide, indium phosphide, or the like can be used. Alternatively, a metal substrate including a stainless steel substrate may be used as the base substrate 204.

Note that heat treatment or pressure treatment may be performed after the base substrate 204 and the bond substrate 200 are attached to each other. The bond strength can be increased with heat treatment or pressure treatment.

Figure 14A:
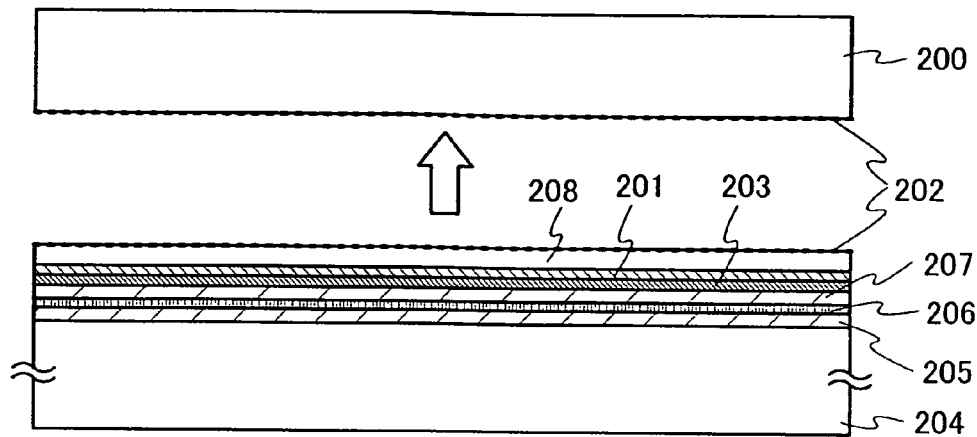
FIGS. 14A to 14C illustrate a method of manufacturing a semiconductor device of the present invention.

Heat treatment is performed after the insulating film 203 and the insulating film 207 are bonded to each other between the bond substrate 200 and the base substrate 204, whereby adjacent microvoids in the weakened layer 202 are coupled to each other, and the volume of the microvoids is increased. As a result, as shown in FIG. 14A, the bond substrate 200 is split along or separated within the weakened layer 202; thus, the semiconductor film 208 which had been a part of the bond substrate 200 is formed over the base substrate 204. The heat treatment is preferably performed at temperature that is equal to or lower than the allowable temperature limit of the base substrate 204. For example, the heat treatment may be performed at a temperature in the range of 400 to 600° C. After the separation, together with the insulating films 201 and 203, the semiconductor film 208 is transferred to the base substrate 204. Thereafter, heat treatment at a temperature from 400 to 600° C. is preferably performed in order to make stronger the bonding between the insulating film 203 and the insulating film 207.

Crystal plane orientation of the semiconductor film 208 can be controlled with the plane orientation of the bond substrate 200. The bond substrate 200 having crystal plane orientation which is suitable for a semiconductor element to be formed may be selected as appropriate. The mobility of the transistor depends on the crystal plane orientation of the semiconductor film 208. In order to obtain a transistor with higher mobility, a direction of bonding of the bond substrate 200 is set in consideration of a direction of a channel and the crystal plane orientation.

Next, a surface of the transferred semiconductor film 208 is planarized. Although the planarization is not necessarily essential, the planarization makes it possible to improve characteristics of the interface between the semiconductor film 208 and a gate insulating film in a transistor to be formed later. Specifically, the planarization can be performed by chemical mechanical polishing (CMP) or liquid jet polishing. The thickness of the semiconductor film 208 is reduced by the planarization.

Note that although this embodiment mode describes the case where a Smart Cut (registered trademark) method is used in which the semiconductor film 208 is separated from the bond substrate 200 by the formation of the weakened layer 202, the semiconductor film 208 may be bonded to the base substrate 204 by any other bonding method such as ELTRAN (epitaxial layer transfer), a dielectric isolation method, or a PACE (plasma assisted chemical etching) method.

Figure 14B:
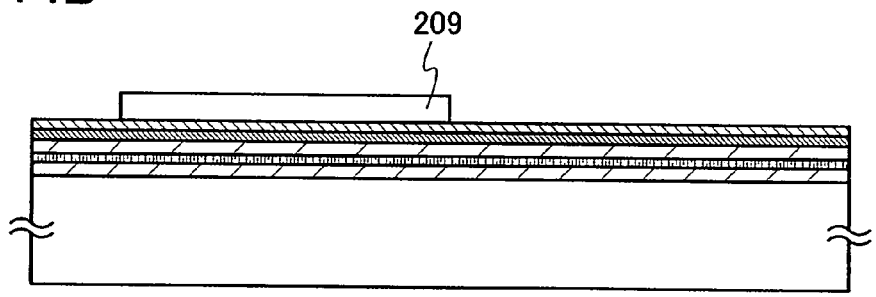

Next, as shown in FIG. 14B, the semiconductor film 208 is processed (patterned) to have a predetermined shape, whereby an island-shaped semiconductor film 209 is formed.

Figure 14C:
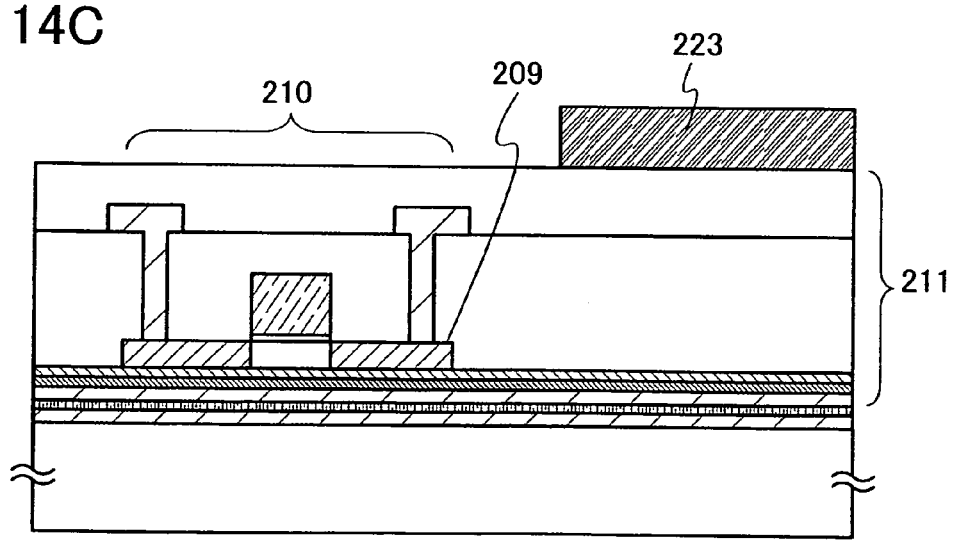

In the present invention, a variety of semiconductor elements such as transistors can be formed with the use of the semiconductor film 209 formed through the above-described steps. FIG. 14C illustrates a transistor 210 formed using the semiconductor film 209.

Then, a conductor 223 functioning as an on-chip antenna is formed over the transistor 210 used in an integrated circuit.

The conductor 223 used as the on-chip antenna can be formed using metal such as silver (Ag), gold (Au), copper (Cu), palladium (Pd), chromium (Cr), platinum (Pt), molybdenum (Mo), titanium (Ti), tantalum (Ta), tungsten (W), aluminum (Al), iron (Fe), cobalt (Co), zinc (Zn), tin (Sn), or nickel (Ni). As the conductor 223 used as the on-chip antenna, a film made of an alloy containing the above-described metal as a main component or a compound containing the above-described metal may be used as well as the film formed from the above-described metal. The conductor 223 used as the on-chip antenna can be formed of a single layer of the above-described film or stacked layers of a plurality of the above-described films.

The conductor 223 used as the on-chip antenna can be formed by a CVD method, a sputtering method, a printing method such as screen printing or gravure printing, a droplet discharging method, a dispensing method, a plating method, a photolithography method, an evaporation method, or the like.

For example, when a screen printing method is used, the conductor 223 used as the on-chip antenna can be formed by selectively printing a conductive paste in which conductive particles each having a particle size of several nm to several ten μm are dispersed in an organic resin onto the insulating film. The conductive particles can be formed using silver (Ag), gold (Au), copper (Cu), nickel (Ni), platinum (Pt), palladium (Pd), tantalum (Ta), molybdenum (Mo), tin (Sn), lead (Pb), zinc (Zn), chromium (Cr), titanium (Ti), or the like. Instead of such a metal, the conductive particles may be formed using an alloy containing the above-described metal as a main component or a compound containing the above-described metal. Alternatively, fine particles of silver halide or dispersible nanoparticles may be used. Further, as the organic resin contained in the conductive paste, polyimide, a siloxane-based resin, an epoxy resin, a silicone resin, or the like can be used.

As examples of an alloy of the above-described metals, the following combinations can be given: silver (Ag) and palladium (Pd), silver (Ag) and platinum (Pt), gold (Au) and platinum (Pt), gold (Au) and palladium (Pd), and silver (Ag) and copper (Cu). Alternatively, conductive particles of copper (Cu) coated with silver (Ag) can be used, for example.

Note that when the conductor 223 used as the on-chip antenna is formed, it is preferable that a conductive paste be applied by a printing method or a droplet discharging method, and then baked. For example, when conductive particles (e.g., a particle size of 1 to 100 nm) containing silver as a main component are used for the conductive paste, an antistatic film functioning as an antenna can be formed by baking the conductive paste at a temperature of 150 to 300° C. Baking may be performed by lamp annealing with an infrared lamp, a xenon lamp, a halogen lamp, or the like, or by furnace annealing with an electric furnace. Alternatively, a laser annealing method with an excimer laser or an Nd:YAG laser may be used. Further alternatively, fine particles containing solder or lead-free solder as a main component may be used; in that case, it is preferable to use fine particles each having a particle size of 20 μm or less. Solder and lead-free solder have an advantage of low cost.

When a printing method or a droplet discharging method is used, the conductor 223 used as the on-chip antenna can be formed without using a mask for light exposure. Moreover, when a droplet discharging method or a printing method is used, waste of a material which would be removed by etching can be avoided unlike in the case of a photolithography method. Further, since an expensive mask for light exposure does not have to be used, costs for manufacturing a semiconductor device can be reduced.

Figure 15A:
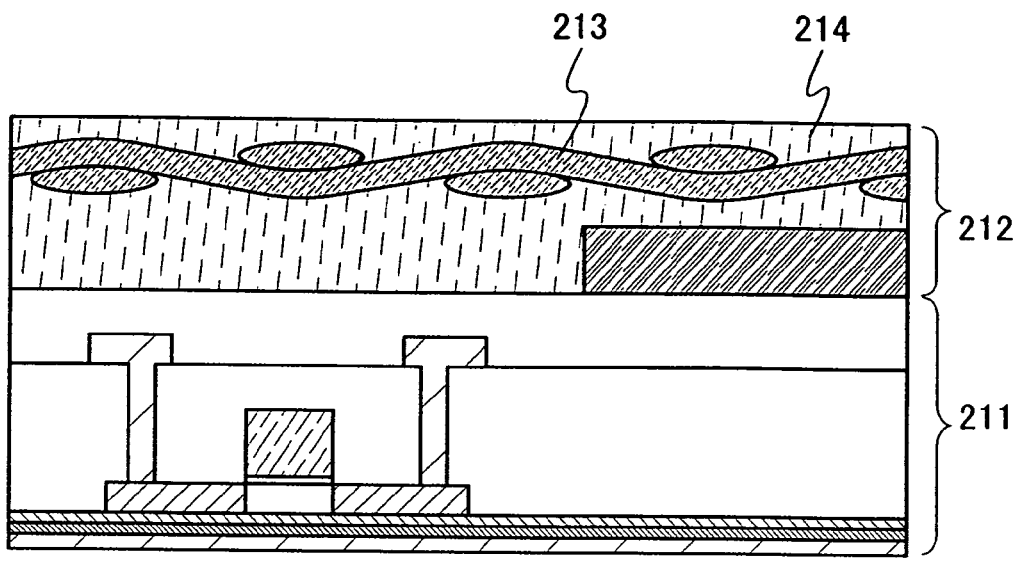
FIGS. 15A and 15B illustrate a method of manufacturing a semiconductor device of the present invention.

Next, as shown in FIG. 15A, a structure body 212 is bonded over the conductor 223 by thermocompression bonding. Then, an element layer 211, the conductor 223, and the structure body 212 are separated from the base substrate 204.

As the structure body 212, an object in which a fiber body 213 is impregnated with an organic resin 214 is used. Such a structure body 212 is also referred to as a prepreg. A prepreg is specifically formed in the following manner: a fiber body is impregnated with a varnish in which a matrix resin is diluted with an organic solvent, and thereafter, drying is performed so that the organic solvent is volatilized and the matrix resin is semi-cured. A thickness of the structure body 212 is preferably 10 to 100 μm, more preferably 10 to 30 μm. When a structure body with such a thickness is used, a thin semiconductor device capable of being bent can be manufactured.

Note that in this embodiment mode, the structure body 212 in which a single-layer fiber body is impregnated with an organic resin is used; however, the present invention is not limited to this structure. A structure body may be used in which a stack of a plurality of fiber bodies is impregnated with an organic resin. Further, when a plurality of structure bodies in each of which a single-layer fiber body is impregnated with an organic resin are stacked, another layer may be interposed between the structure bodies.

In the structure body 212, the organic resin 214 is plasticized or cured by thermocompression bonding. When the organic resin 214 is an organic plastic resin, the organic resin which is plasticized is then cured by cooling the organic resin to room temperature. By heating and pressure bonding, the organic resin 214 is uniformly spread so as to be in close contact with the element layer 211, and is cured. The step in which the structure body 212 is subjected to pressure bonding is performed under an atmospheric pressure or a reduced pressure.

The separation occurs in the separation layer 206. The separation can be performed using physical force, for example, by pulling by a human hand or a gripping tool, or separating while rolling a roller. The separation layer 206 may partially remain without being entirely removed.

Note that a method in which a metal oxide film is used for the separation layer and the element layer 211 is separated using physical means is used in this embodiment mode; however, a separation method used in the present invention is not limited thereto. For example, a method may be used in which a light-transmitting base substrate 204 is used, amorphous silicon containing hydrogen is used for the separation layer 206, and the separation layer 206 is irradiated with a laser beam from the base substrate 204 side to vaporize hydrogen contained in the amorphous silicon, so that the base substrate 204 is separated from the element layer 211.

Alternatively, the separation may be performed by a method of etching the separation layer 206. In this case, a trench is formed so as to partly expose the separation layer 206. The trench is formed by dicing, scribing, processing using a laser beam including UV light, a photolithography method, or the like. The trench may be deep enough to expose the separation layer 206. Then, halogen fluoride is used as an etching gas, and the gas is introduced through the trench. In this embodiment mode, etching is performed under the conditions of, for example, using $ClF_3$ (chlorine trifluoride), a temperature of 350° C., a flow rate of 300 sccm, an atmospheric pressure of 800 Pa, and a period of three hours. Alternatively, nitrogen may be mixed into the $ClF_3$ gas. When halogen fluoride such as $ClF_3$ is used, the separation layer 206 can be selectively etched, and the base substrate 204 can be separated from the element layer 211. Note that halogen fluoride may be either gas or liquid.

Alternatively, by a method in which the base substrate 204 is removed by mechanical polishing or a method in which the base substrate 204 is removed by dissolution of the substrate with a solution such as HF, the element layer 211 can be separated from the base substrate 204. In this case, the separation layer 206 is not necessarily used.

Figure 15B:
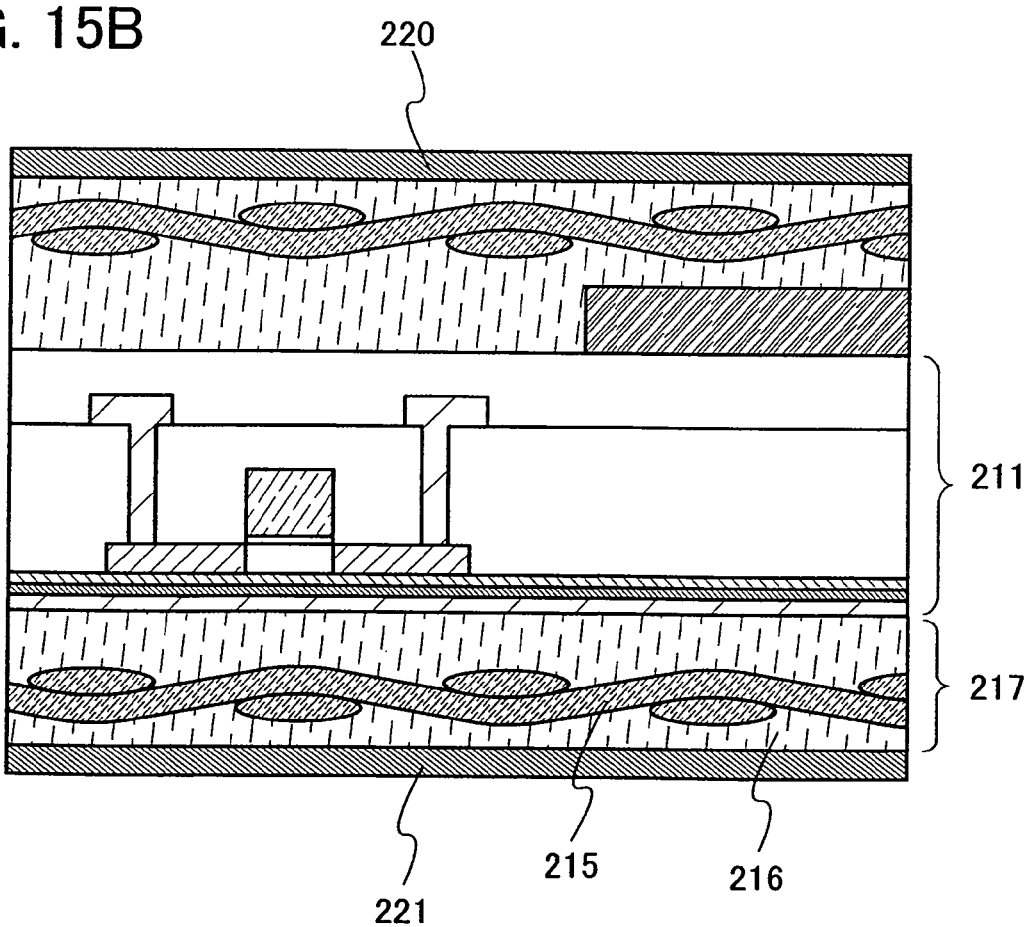

Next, as shown in FIG. 15B, a structure body 217 in which a fiber body 215 is impregnated with an organic resin 216 is superposed on the side of the element layer 211, which is exposed by the above-described separation. The thickness of the structure body 217 is preferably 10 to 100 μm, more preferably 10 to 30 μm. When a structure body with such a thickness is used, a thin semiconductor device capable of being bent can be manufactured.

Note that the structure body 217 in which a single-layer fiber body is impregnated with an organic resin is used in this embodiment mode; however, the present invention is not limited to this structure. A structure body may be used in which a stack of a plurality of fiber bodies is impregnated with an organic resin. Further, when a plurality of structure bodies in each of which a single-layer fiber body is impregnated with an organic resin are stacked, another layer may be interposed between the structure bodies.

Next, the structure body 217 is heated and subjected to pressure bonding so that the organic resin 216 of the structure body 217 is plasticized or cured. When the organic resin 216 is an organic plastic resin, the organic resin which is plasticized is then cured by cooling the organic resin to room temperature. By thermocompression bonding, the organic resin 216 is uniformly spread so as to be in close contact with the element layer 211, and is cured. The step in which the structure body 217 is subjected to pressure bonding is performed under an atmospheric pressure or a reduced pressure.

Next, an antistatic film 220 and an antistatic film 221 are formed in surfaces of the structure body 212 and the structure body 217 respectively, which do not face the element layer 211. Each of the antistatic films 220 and 221 has conductivity and a surface resistance value of approximately $10^6$ to $10^{14}$ $\Omega/cm^2$. For the antistatic films 220 and 221, a surfactant, a conductive polymer, a resin in which conductive particles such as carbon black or silver are dispersed, a siloxane-based resin, a siloxane-based material, or the like can be used. Specific examples of the surfactant include a nonionic surfactant such as glycerin fatty acid ester, polyoxyethylene alkyl ether, polyoxyethylene alkyl phenyl ether, N,N-bis(2-hydroxyethyl)alkylamine, N-2-hydroxyethyl-N-2-hydroxyalkylamine, polyoxyethylene alkylamine, polyoxyethylene alkylamine fatty acid ester, and alkyl diethanolamide; an anionic surfactant such as alkyl sulfonate, alkyl benzene sulfonate, and alkyl phosphate; a cationic surfactant such as tetraalkylammonium salt and trialkylbenzylammonium salt; and an amphoteric surfactant such as alkyl betaine and alkyl imidazolium betaine. When the surfactant is used, the thickness of each of the antistatic films 220 and 221 is preferably approximately 0.01 to 1 μm. Examples of the conductive polymer include polypyrrole-based and polythiophene-based polymers.

When a siloxane-based resin is used, the antistatic films 220 and 221 can be formed in the following manner. A liquid obtained by dissolving or dispersing a siloxane-based resin or a siloxane-based material in alcohol such as isopropyl alcohol, ethanol, propanol, or butanol is applied to the structure bodies 212 and 217 by a method such as dipping, spray coating, wiping with cloth, gravure coating, roll coating, or printing, and dried or baked after being dried.

Note that an example in which the antistatic films 220 and 221 are formed on the surfaces of the structure bodies 212 and 217 respectively, which do not face the element layer 211, is described in this embodiment mode; however, the present invention is not limited to this structure. When the antistatic films 220 and 221 are formed on surfaces of the structure bodies 212 and 217 respectively, which are on the element layer 211 side, the antistatic films 220 and 221 are preferably formed before the structure bodies 212 and 217 are attached to the element layer 211. In this case also, the conductive antistatic film 220 having a surface resistance value of approximately $10^6$ to $10^{14}$ $\Omega/cm^2$ is used in the present invention; thus, a function of the on-chip antenna is not damaged even if the conductor 223 used as the on-chip antenna and the antistatic film 220 are in direct contact with each other.

When semiconductor elements forming a plurality of semiconductor devices are formed between the structure bodies 212 and 217, the element layer 211 is cut so that each semiconductor device is separated. The element layer 211 can be cut using a laser irradiation device, a dicing device, a scribing device, a cutting device having an edged tool such as scissors or a knife, or the like. When a laser irradiation device is used, any of the following lasers can be used: an excimer laser such as a KrF, ArF, or XeCl laser; a gas laser such as a He, He—Cd, Ar, He—Ne, HF, or $CO_2$ laser; a solid-state laser such as a crystal laser using crystals such as YAG, $GdVO_4$, $YVO_4$, YLF, or $YAlO_3$ which are doped with Cr, Nd, Er, Ho, Ce, Co, Ti, or Tm, a glass laser, or a ruby laser; or a semiconductor laser such as a GaN, GaAs, GaAlAs, or InGaAsP laser. Note that a fundamental wave to a fifth harmonic wave are preferably used in a solid-state laser as appropriate.

According to the present invention, a highly reliable semiconductor device which is not likely to be damaged by external force, in particular, pressing force and can prevent electrostatic discharge can be provided.

This embodiment mode can be implemented in combination with other embodiment modes and embodiments as appropriate.

Embodiment Mode 8

In this embodiment mode, an example is described in which a fiber body is disposed so as to overlap with an element layer and the fiber body is impregnated with an organic resin, whereby a structure body which is fixed to the element layer is formed.

Figure 16A:
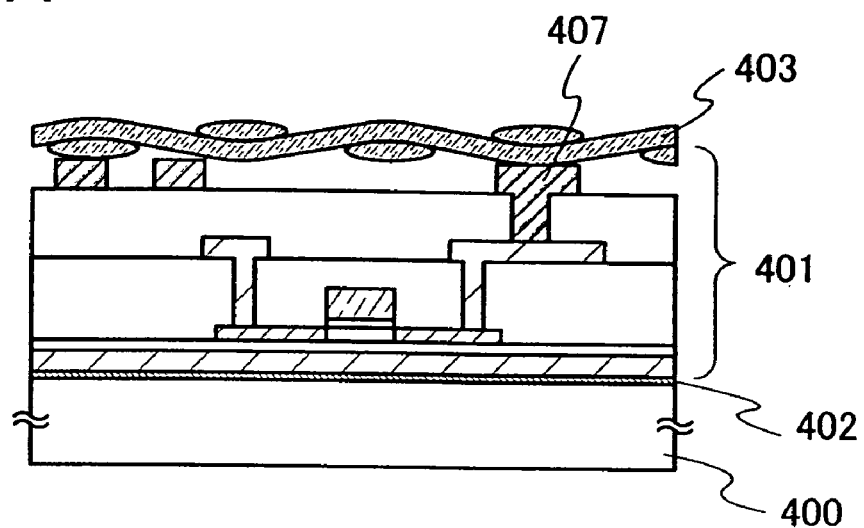
FIGS. 16A to 16C illustrate a method of manufacturing a semiconductor device of the present invention.

First, as shown in FIG. 16A, an element layer 401 and a conductor 407 functioning as an on-chip antenna are formed over a substrate 400. In FIG. 16A, a separation layer 402 is formed between the element layer 401 and the substrate 400 in order to facilitate separation of the element layer 401 from the substrate 400 later; however, the present invention is not limited to this structure. The separation layer 402 is not necessarily provided, or another layer may be added as necessary depending on a separation method.

Then, a fiber body 403 is stacked over the element layer 401 so as to overlap with the element layer 401 and the conductor 407. The fiber body 403 is a woven fabric or a nonwoven fabric using high-strength fibers of an organic compound or an inorganic compound, and the fiber body 403 covers the entire surface of the element layer 401 and the conductor 407. A high-strength fiber is specifically a fiber with a high tensile modulus of elasticity or a high Young's modulus. Typical examples of the high-strength fiber include a polyvinyl alcohol fiber, a polyester fiber, a polyamide fiber, a polyethylene fiber, an aramid fiber, a polyparaphenylene benzobisoxazole fiber, a glass fiber, and a carbon fiber. Examples of the glass fiber include a glass fiber using E glass, S glass, D glass, Q glass, and the like. Note that the fiber body 403 may be formed from one kind or a plurality of the above-described high-strength fibers.

Alternatively, the fiber body 403 may be a woven fabric formed using bundles of fibers (single yarns) (hereinafter, the bundles of fibers are referred to as yarn bundles) for the warp yarn and the weft yarn, or a nonwoven fabric obtained by stacking yarn bundles of plural kinds of fibers in a random manner or in one direction. In the case of a woven fabric, a plain-woven fabric, a twilled fabric, a satin-woven fabric, or the like can be used as appropriate.

The yarn bundle may have a cross section of a circular shape or an elliptical shape. As the yarn bundle of fibers, a yarn bundle of fibers which has been subjected to fiber opening with a high-pressure water stream, high-frequency vibration using liquid as a medium, continuous ultrasonic vibration, pressing with a roller, or the like may be used. A yarn bundle of fibers which is subjected to fiber opening has a large width, has a smaller number of single yarns in the thickness direction, and has a cross section of an elliptical shape or a flat shape. Further, when a loosely twisted yarn is used as the yarn bundle of fibers, the yarn bundle is easily flattened and has a cross section of an elliptical shape or a flat shape. By using a yarn bundle having a cross section of an elliptical shape or a flat shape as described above, the thickness of the structure body 403 can be made thin. Thus, a thin semiconductor device can be manufactured. An effect of the present invention is confirmed when the diameter of the yarn bundle is 4 to 200 μm as well as 4 to 400 μm. Theoretically, the diameter of the yarn bundle may be even smaller. Moreover, an effect of the present invention is confirmed when the thickness of the fiber is 4 to 20 μm. Theoretically, the thickness of the fiber may be even smaller, and the thickness of the fiber depends on a material of the fiber.

Figure 16B:
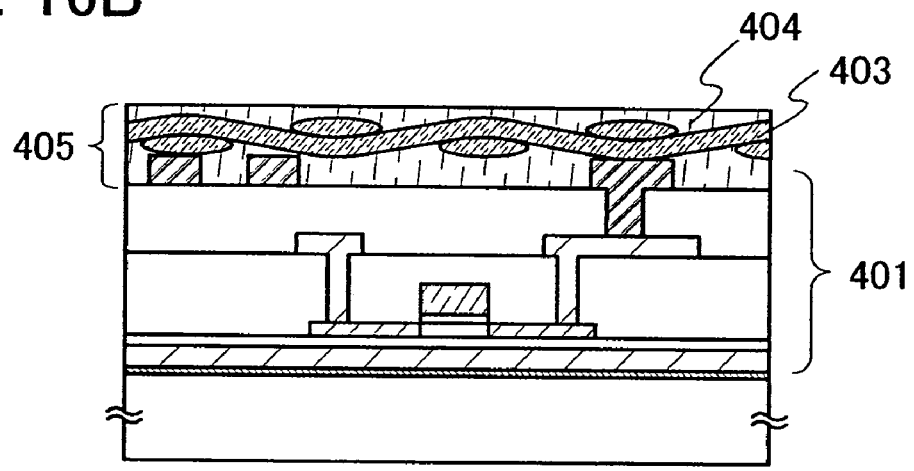

Next, as shown in FIG. 16B, the fiber body 403 is impregnated with an organic resin 404. The organic resin 404 is plasticized or cured by heating, whereby a structure body 405 fixed onto the element layer 401 and the conductor 407 is formed. When the organic resin is an organic plastic resin, the organic resin which is plasticized is then cured by cooling the organic resin to room temperature.

For the organic resin 404, thermosetting resin such as an epoxy resin, an unsaturated polyester resin, a polyimide resin, a bismaleimide-triazine resin, or a cyanate resin; a thermoplastic resin such as a polyphenylene oxide resin, a polyetherimide resin, or a fluorine resin; or a plurality of resins selected from the above-described thermosetting resins and thermoplastic resins can be used. When the above-described organic resin is used, the fiber body can be fixed to the element layer by heat treatment. The higher the glass transition temperature of the organic resin 404 is, the less the organic resin 404 is destroyed by locally applied pressure, which is preferable.

As a method of impregnation with the organic resin 404, a printing method, a cast method, a droplet discharging method, a dip coating method, or the like can be used.

Highly thermally conductive filler may be dispersed in the organic resin 404 or the yarn bundle of the fiber body 403. Examples of the highly thermally conductive filler include aluminum nitride, boron nitride, silicon nitride, alumina, and metal particles of silver, copper, or the like. When the conductive filler is included in the organic resin or the yarn bundle of fibers, heat generated in the element layer can be easily released to the outside. Accordingly, thermal storage in the semiconductor device can be suppressed, and defects of the semiconductor device can be reduced.

Note that an example in which the structure body 405 includes the single-layer fiber body 403 is described in this embodiment mode; however, the present invention is not limited to this structure. The structure body 405 may include the fiber body 403 of two or more layers. Further, the structure body 405 and the conductor 407 are directly fixed to each other in this embodiment mode; however, another layer such as an insulating film may be provided between the structure body 405 and the conductor 407.

Figure 16C:
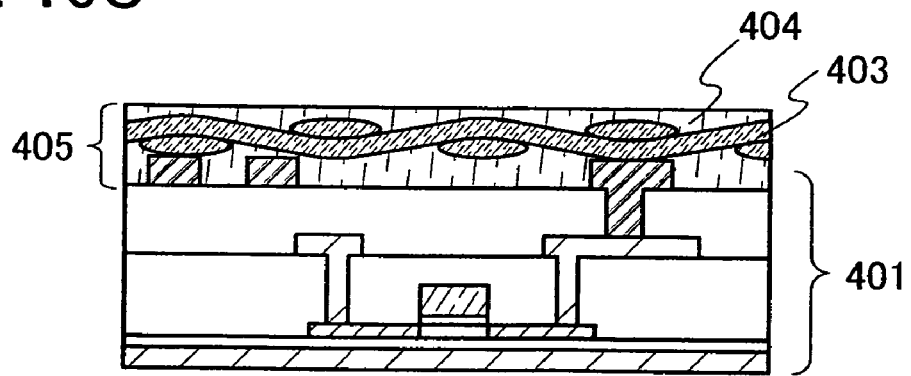

Next, as shown in FIG. 16C, the substrate 400 is separated from the element layer 401. The separation can be performed within the separation layer 402. As a method of separating the element layer 401, any of the following methods as described in Embodiment Mode 6 or 7 can be used: a method in which the element layer 401 and the substrate 400 are split in a separation layer by using physical force; a method in which amorphous silicon containing hydrogen is used for the separation layer 402 and the separation layer 402 is irradiated with a laser beam from the substrate 400 side to vaporize hydrogen contained in the amorphous silicon, so that the substrate 400 is separated from the element layer 401; a method of etching the separation layer 402; a method of removing the substrate 400 by mechanical polishing; and a method of removing the substrate 400 by dissolution of the substrate 400 with a solution such as HF.

Figure 17A:
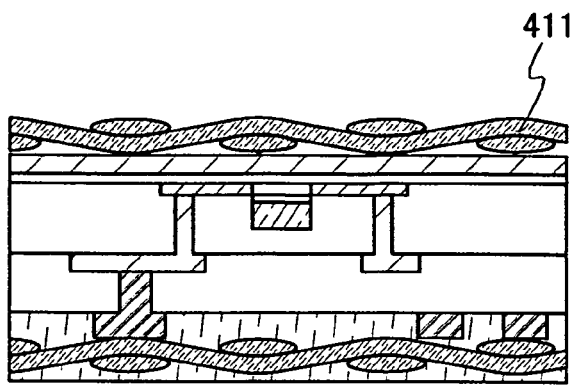
FIGS. 17A to 17C illustrate a method of manufacturing a semiconductor device of the present invention.
Figure 17B:
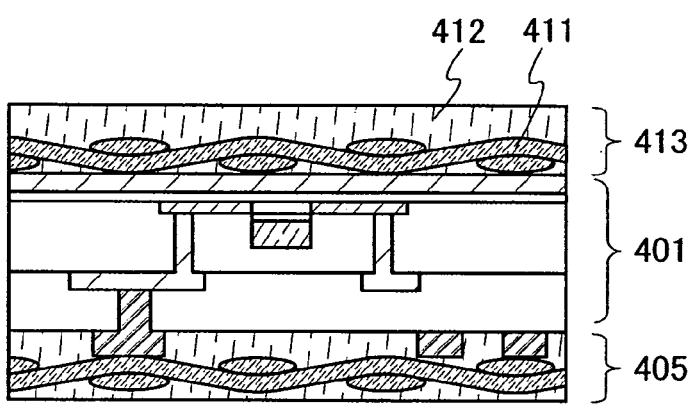

Next, a fiber body 411 is superposed so as to overlap with a surface of the substrate 400, which is exposed by the separation as shown in FIG. 17A, and thereafter, the fiber body 411 is impregnated with an organic resin 412 as shown in FIG. 17B. Then, the organic resin 412 is plasticized or cured by heating, whereby a structure body 413 fixed to the element layer 401 is formed. The structure body 413 overlaps with the structure body 405 with the element layer 401 interposed therebetween. When the organic resin is an organic plastic resin, the organic resin which is plasticized is then cured by cooling the resin to room temperature.

Note that the structure body 413 includes the single-layer structure body 411 in this embodiment mode; however, the present invention is not limited to this structure. The structure body 413 may include the fiber body 411 of two or more layers.

Figure 17C:
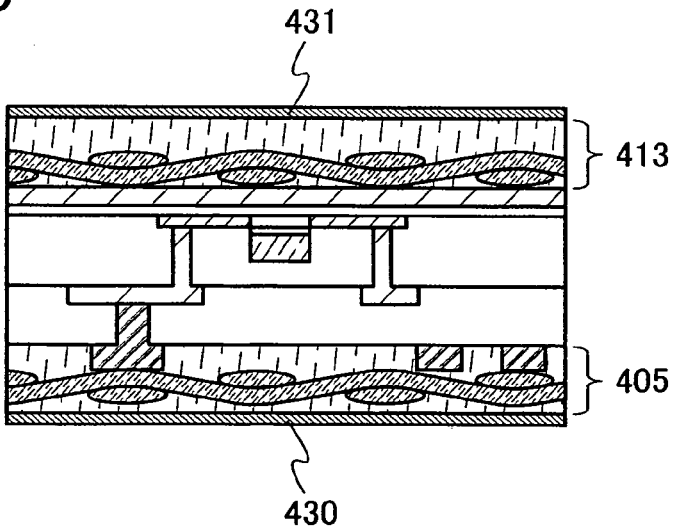

Next, as shown in FIG. 17C, an antistatic film 430 and an antistatic film 431 are formed on surfaces of the structure body 405 and the structure body 413 respectively, which do not face the element layer 401. Each of the antistatic films 430 and 431 has conductivity and a surface resistance value of approximately $10^6$ to $10^{14}$ $\Omega/cm^2$. For the antistatic films 430 and 431, a surfactant, a conductive polymer, a resin in which conductive particles such as carbon black or silver are dispersed, a siloxane-based resin, a siloxane-based material, or the like can be used. Specific examples of the surfactant include a nonionic surfactant such as glycerin fatty acid ester, polyoxyethylene alkyl ether, polyoxyethylene alkyl phenyl ether, N,N-bis(2-hydroxyethyl)alkylamine, N-2-hydroxyethyl-N-2-hydroxyalkylamine, polyoxyethylene alkylamine, polyoxyethylene alkylamine fatty acid ester, and alkyl diethanolamide; an anionic surfactant such as alkyl sulfonate, alkyl benzene sulfonate, and alkyl phosphate; a cationic surfactant such as tetraalkylammonium salt and trialkylbenzylammonium salt; and an amphoteric surfactant such as alkyl betaine and alkyl imidazolium betaine. When the surfactant is used, the thickness of each of the antistatic films 430 and 431 is preferably approximately 0.01 to 1 μm. Examples of the conductive polymer include polypyrrole-based and polythiophene-based polymers.

When a siloxane-based resin is used, the antistatic films 430 and 431 can be formed in the following manner. A liquid obtained by dissolving or dispersing a siloxane-based resin or a siloxane-based material in alcohol such as isopropyl alcohol, ethanol, propanol, or butanol is applied to the structure bodies 405 and 413 by a method such as dipping, spray coating, wiping with cloth, gravure coating, roll coating, or printing, and dried or baked after being dried.

Note that the structure body 405 and the structure body 413 are set to have almost the same thickness. Accordingly, when a semiconductor device is bent by application of stress, pressure can be prevented from being locally applied to the element layer 401 and the conductor 407 provided between the structure bodies 405 and 413. Thus, reliability of the semiconductor device can be increased.

According to the present invention, a highly reliable semiconductor device which is not likely to be damaged by external force, in particular, pressing force and can prevent electrostatic discharge can be provided.

This embodiment mode can be implemented in combination with other embodiment modes and embodiments as appropriate.

Embodiment 1

In this embodiment, the shape of a booster antenna included in the semiconductor device of the present invention is described.

The booster antenna included in the semiconductor device of the present invention can be divided into a loop-shaped portion which is chiefly electromagnetically coupled to an on-chip antenna and a portion which chiefly receives an electric wave from an interrogator. It is acceptable as long as the booster antenna in the portion which chiefly receives an electric wave from the interrogator has a shape which makes it possible to receive an electric wave.

Figure 18A:
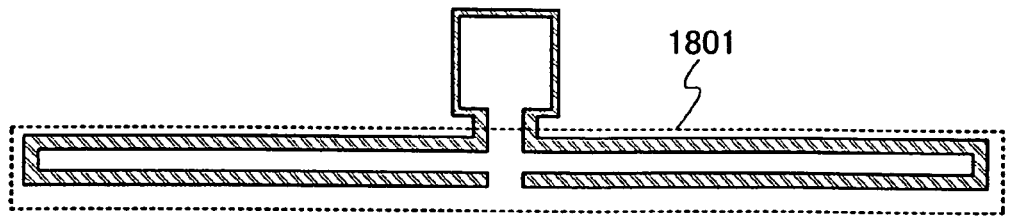
FIGS. 18A to 18D each illustrate a shape of a booster antenna.
Figure 18B:
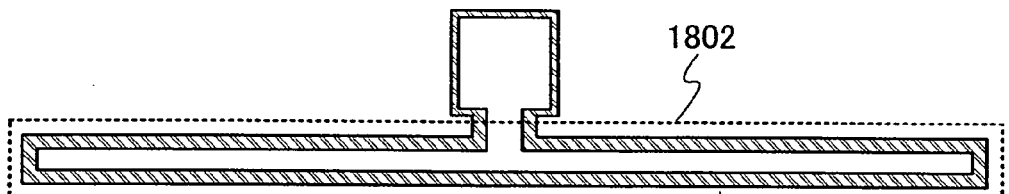
Figure 18C:
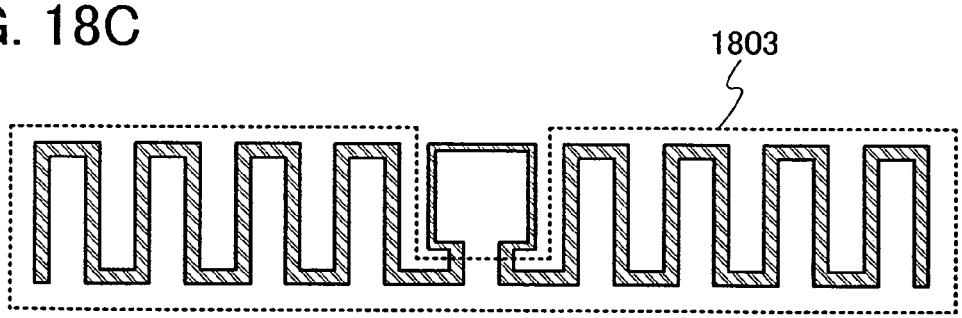
Figure 18D:
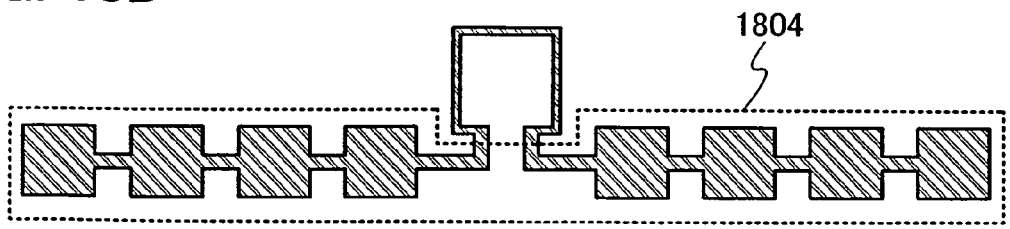

FIG. 18A illustrates an example of a booster antenna in which a portion 1801 which chiefly receives an electric wave forms a folded dipole antenna. FIG. 18B illustrates an example of a booster antenna in which a portion 1802 which chiefly receives an electric wave is loop-shaped. FIG. 18C illustrates an example of a booster antenna in which a portion 1803 which chiefly receives an electric wave forms a meander line antenna. FIG. 18D illustrates an example of a booster antenna in which a portion 1804 which chiefly receives an electric wave has a shape such that a plurality of patch elements are connected.

Note that in the present invention, the shape of the portion which chiefly receives an electric wave from an interrogator is not limited to those described above.

This embodiment can be implemented in combination with other embodiment modes and embodiments as appropriate.

Embodiment 2

In this embodiment, a positional relationship between an on-chip antenna and a booster antenna is described.

When alternating current flows through the booster antenna, a loop-shaped portion included in the booster antenna and the on-chip antenna are electromagnetically coupled to each other, and thus, induced electromotive force is generated in the on-chip antenna. The on-chip antenna and the loop-shaped portion included in the booster antenna may partially overlap with each other with a structure body interposed therebetween, or may be disposed in different regions so as not to overlap with each other. Note that the on-chip antenna is disposed at the position where magnetic flux generated in the loop-shaped portion included in the booster antenna is most concentrated, whereby induced electromotive force generated in the on-chip antenna can be increased.

Further, impedances are matched between the booster antenna, and the on-chip antenna and an integrated circuit, whereby loss of power due to reflection can be reduced. Note that since reactance corresponding to an imaginary part of the impedance is changed in accordance with the value of capacitance generated between the booster antenna and the on-chip antenna, the area of a portion where the booster antenna and the on-chip antenna overlap with each other needs to be considered at the design stage for impedance matching. However, it may be assumed that, when the booster antenna and the on-chip antenna are attached with a structure body interposed therebetween, the attachment is not precisely performed at a given position and thus, the booster antenna and the on-chip antenna are displaced from each other. Moreover, in the worst case, the impedances cannot be matched by change in capacitance value.

Figure 19A:
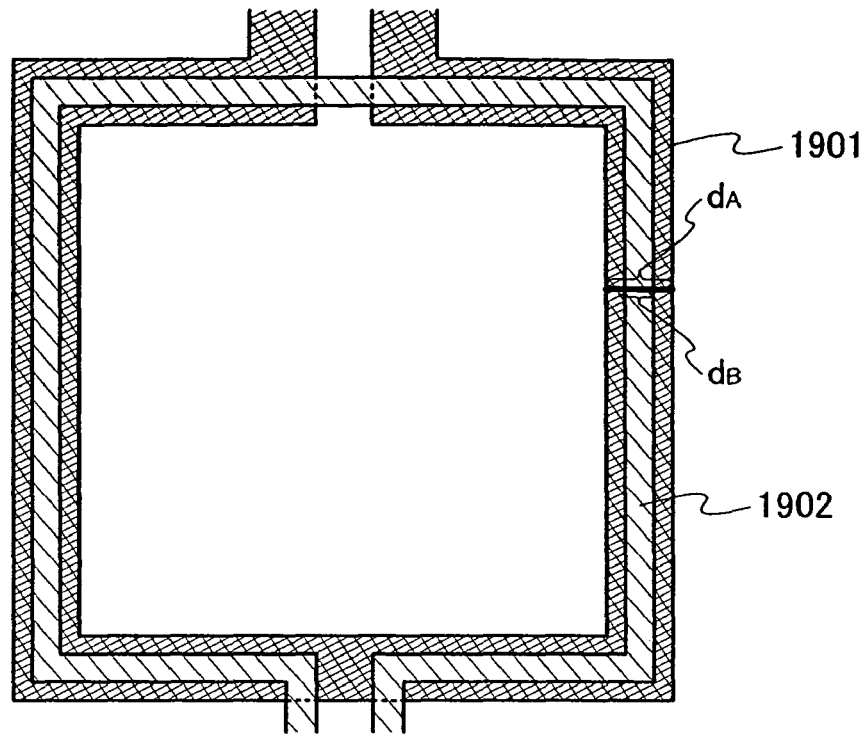
FIGS. 19A and 19B each illustrate a positional relationship between a booster antenna and an on-chip antenna.

Accordingly, in this embodiment, as shown in FIG. 19A, when the width of a loop-shaped portion 1901 included in a booster antenna is denoted by $d_A$ and the width of an on-chip antenna 1902 is denoted by $d_B$, values of $d_A$ and $d_B$ are set so as to satisfy $d_A > d_B$. An inner edge and an outer edge of the on-chip antenna 1902 overlap with the loop-shaped portion 1901 included in the booster antenna except a region where the loop of the on-chip antenna 1902 is broken and a region where the loop of the loop-shaped portion 1901 included in the booster antenna is broken.

Figure 19B:
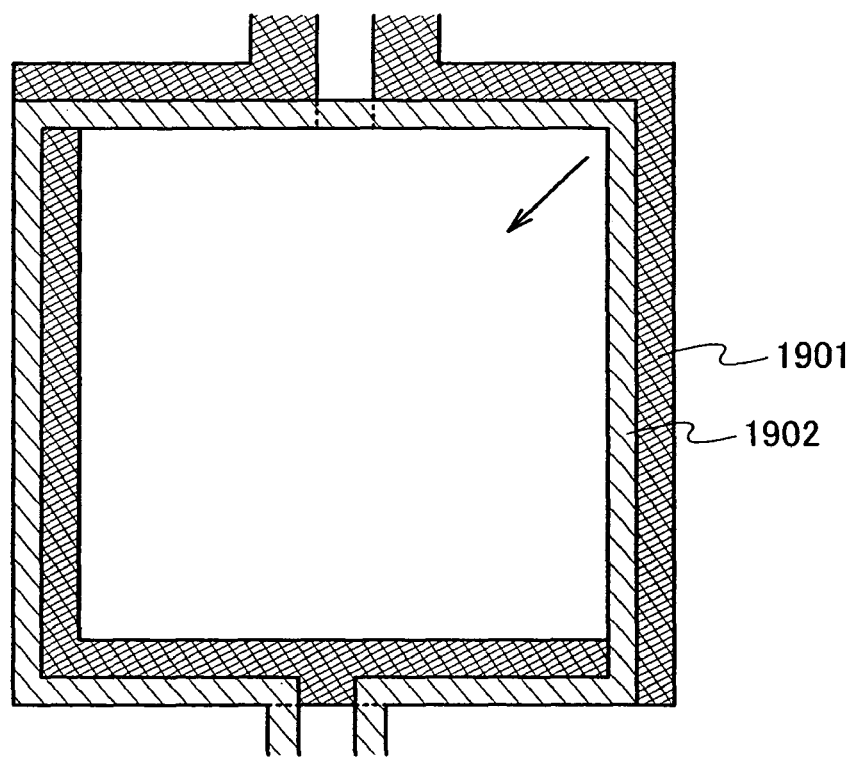

With the above-described structure, even when the loop-shaped portion 1901 included in the booster antenna and the on-chip antenna 1902 shown in FIG. 19A are attached with a deviation in the direction of an arrow in FIG. 19B, for example, the area of the portion where the loop-shaped portion 1901 included in the booster antenna and the on-chip antenna 1902 overlap with each other can be kept almost constant. Accordingly, change in capacitance value can be prevented even when alignment accuracy is not high in attachment, and a semiconductor device can be manufactured without impedance mismatching.

This embodiment can be implemented in combination with other embodiment modes and embodiments as appropriate.

Embodiment 3

Since the semiconductor device of the present invention has flexibility, it is preferably attached to an object having flexibility or an object having a curved surface. Further, since the semiconductor device of the present invention has not only high shock and vibration resistance but also high reliability in terms of resistance to locally applied pressure, the range of uses of the semiconductor device is wide.

When an integrated circuit in the semiconductor device of the present invention includes a memory such as a ROM in which data cannot be rewritten, it is possible to prevent counterfeiting of an object to which the semiconductor device is attached. Further, when the semiconductor device of the present invention is used for foods whose commercial value depends crucially on a production area, a producer, and the like, for example, forgery of the production area, the producer, and the like can be prevented.

Specifically, the semiconductor device of the present invention can be attached to a tag having information on the object, such as a shipping tag, a price tag, and a name tag. Moreover, the semiconductor device of the present invention itself can be used as a tag. Alternatively, the semiconductor device of the present invention can be attached to a certificate corresponding to a document stating that a fact is true, such as a family register, a resident card, a passport, a driver's license, an identification card, a membership card, a survey report, a credit card, a cash card, a prepaid card, a patient's registration card, and a commuter pass, for example. Further alternatively, the semiconductor device of the present invention can be attached to securities corresponding to securities stating private property rights, such as a bill of exchange, a check, a receipt note, a bill of lading, a warehouse receipt, a stock, a bond, a gift certificate, and a mortgage certificate, for example.

For example, the semiconductor device of the present invention may be attached to a label of the article to perform distribution management of the article using the semiconductor device.

Figure 20A:
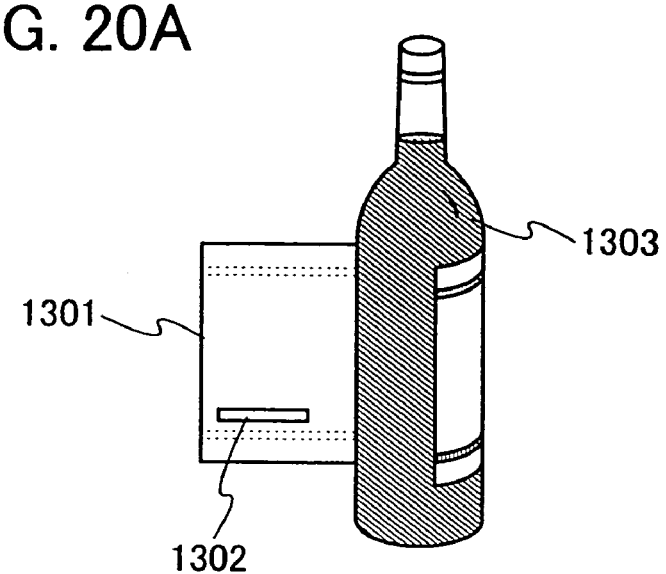
FIGS. 20A to 20C each illustrate an application mode of a semiconductor device of the present invention.

As shown in FIG. 20A, a semiconductor device 1302 of the present invention is attached to a support such as a product label 1301 whose rear surface has adhesiveness. The label 1301 to which the semiconductor device 1302 is attached is put on an article 1303. Identification data on the article 1303 can be read wirelessly from the semiconductor device 1302 attached to the label 1301. Accordingly, the semiconductor device 1302 facilitates article management in the distribution process. The semiconductor device of the present invention has an advantage in that it is not easily destroyed by stress even when attached to the label 1301 having flexibility. Therefore, it is preferable to attach the label 1301 using the semiconductor device of the present invention to the object having a curved surface. Further, since the semiconductor device 1302 of the present invention has high reliability in terms of resistance to pressing force, the semiconductor device 1302 is not likely to be destroyed by static electricity generated by pressing force or friction in the distribution process.

For example, when a rewritable nonvolatile memory is used as a memory included in an integrated circuit in the semiconductor device 1302, the distribution process of the article 1303 can be recorded. Moreover, when the production process of the product is recorded, a wholesaler, a retailer, and a consumer can easily find out a production area, a producer, a date of manufacture, a processing method, and the like.

Figure 20B:
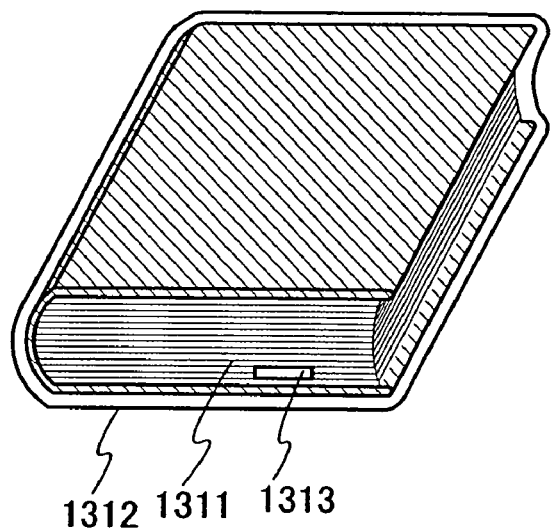

In the case of items having value on their contained information, for example, books, DVDs, and CDs, there is a problem in that disclosure of total information contained in the items lowers their value as items; on the other hand, veiling information completely makes it difficult to appreciate their value as items. Wrapping the above items with a wrapping material to which the semiconductor device of the present invention is attached, and then storing part of information contained in the items in the semiconductor device enable customers to appreciate value of the items without lowering value of the items. FIG. 20B illustrates a book 1311 wrapped with a wrapping material 1312 to which a semiconductor device 1313 of the present invention is attached.

Then, when a function as an interrogator is added to a portable information terminal like a mobile phone, for example, customers can grasp a part of contents of the book 1311.

With the above structure, even if total information contained in the items is not disclosed, customers can know the contents of the items.

Figure 20C:
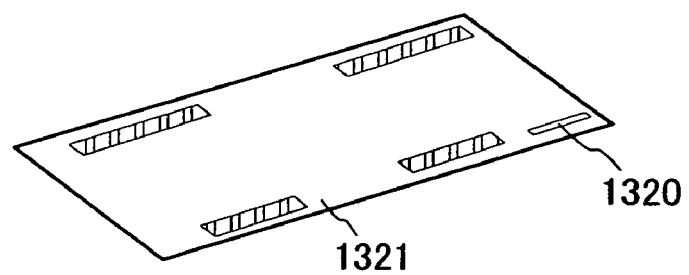

FIG. 20C illustrates an example of a bearer bond 1321 to which a semiconductor device 1320 of the present invention is attached. The bearer bond 1321 includes, but is not limited to, a stamp, a ticket, an admission ticket, a gift certificate, a book coupon, a stationery coupon, a beer coupon, a rice coupon, a variety of gift coupons, a variety of service coupons, and the like in its category. Note that the semiconductor device 1320 may be formed inside the bearer bond 1321 or formed on a surface of the bearer bond 1321 so as to be exposed. The semiconductor device of the present invention has advantages in that it is not likely to be destroyed by stress even when attached to the bearer bond 1321 having flexibility and by static electricity generated by friction.

This embodiment can be implemented in combination with other embodiment modes and embodiments as appropriate.

This application is based on Japanese Patent Application serial No. 2007-195497 filed with Japan Patent Office on Jul. 27, 2007, the entire contents of which are hereby incorporated by reference.

What is claimed is:

1. A semiconductor device comprising:
an integrated circuit;
a first antenna connected to the integrated circuit;
a pair of structure bodies,
wherein the integrated circuit and the first antenna are interposed between the pair of structure bodies,
wherein at least one first antistatic film is formed on at least one surface of one of the pair of structure bodies, and
wherein at least one second antistatic film is formed on at least one surface of the other of the pair of structure bodies;
a second antenna provided so that one of the pair of structure bodies is interposed between the first antenna and the second antenna,
wherein each of the pair of structure bodies is formed by impregnating a fiber body with a resin.

2. A semiconductor device comprising:
an integrated circuit;
a first antenna connected to the integrated circuit;
a pair of structure bodies, wherein the integrated circuit and the first antenna are interposed between the pair of structure bodies; and
a second antenna provided so that one of the pair of structure bodies is interposed between the first antenna and the second antenna,
wherein each of the pair of structure bodies is formed by impregnating a fiber body with a resin, and
wherein when alternating current flows through one of the first antenna and the second antenna, induced electromotive force is generated by electromagnetic induction in the other of the first antenna and the second antenna.

3. The semiconductor device according to claim 1,
wherein the one surface of the one of the pair of structure bodies is not facing the integrated circuit and the first antenna, and
wherein the one surface of the other of the pair of structure bodies is not facing the integrated circuit and the first antenna.

4. The semiconductor device according to claim 1,
wherein the one surface of the one of the pair of structure bodies is facing the integrated circuit and the first antenna, and wherein the one surface of the other of the pair of structure bodies is facing the integrated circuit and the first antenna.

5. The semiconductor device according to claim 1, wherein the first antistatic film is formed on opposite sides of the one of the pair of structure bodies, and
wherein the second antistatic film is formed on opposite sides of the other of the pair of structure bodies.

6. The semiconductor device according to claim 1, wherein the pair of structure bodies have an insulating property.

7. The semiconductor device according to claim 1, wherein the antistatic film is one of a surfactant, a conductive polymer, a resin in which conductive particles are dispersed, and a siloxane-based resin.

8. The semiconductor device according to claim 1, wherein the antistatic film has a surface resistance value of $10^6$ to $10^{14}$ $\Omega/cm^2$.

9. The semiconductor device according to claim 1,
wherein the first antenna is loop-shaped,
wherein a part of the second antenna is loop-shaped,
wherein a width of the first antenna is smaller than a width of a part of the second antenna, and
wherein an inner edge and an outer edge of the first antenna overlap with the second antenna.

10. The semiconductor device according to claim 1,
wherein the first antenna is loop-shaped with one winding,
wherein a part of the second antenna is loop-shaped with one winding,
wherein a width of the first antenna is smaller than a width of a part of the second antenna, and
wherein an inner edge and an outer edge of the first antenna overlap with the second antenna.

11. The semiconductor device according to claim 1, wherein a thin film transistor is used in the integrated circuit.

12. The semiconductor device according to claim 1, wherein when alternating current flows through one of the first antenna and the second antenna, induced electromotive force is generated by electromagnetic induction in the other of the first antenna and the second antenna.

13. The semiconductor device according to claim 1,
wherein the fiber body includes a warp yarn and a weft yarn in each of which a plurality of single yarns of an organic compound or an inorganic compound are bundled, and
wherein directions of the warp yarn and the weft yarn are different in the pair of structure bodies.

14. The semiconductor device according to claim 1, wherein one of a polyvinyl alcohol fiber, a polyester fiber, a polyamide fiber, a polyethylene fiber, an aramid fiber, a polyparaphenylene benzobisoxazole fiber, a glass fiber, and a carbon fiber is used for the fiber body.

15. The semiconductor device according to claim 1, wherein the resin includes one of a thermosetting resin or a thermoplastic resin.

16. The semiconductor device according to claim 15, wherein the thermosetting resin is one of an epoxy resin, an unsaturated polyester resin, a polyimide resin, a bismaleimide-triazine resin, and a cyanate resin.

17. The semiconductor device according to claim 15, wherein the thermoplastic resin is one of a polyphenylene oxide resin, a polyetherimide resin, and a fluorine resin.

18. The semiconductor device according to claim 2, wherein the pair of structure bodies have an insulating property.

19. The semiconductor device according to claim 2,
wherein the first antenna is loop-shaped,
wherein a part of the second antenna is loop-shaped,
wherein a width of the first antenna is smaller than a width of a part of the second antenna, and
wherein an inner edge and an outer edge of the first antenna overlap with the second antenna.

20. The semiconductor device according to claim 2,
wherein the first antenna is loop-shaped with one winding,
wherein a part of the second antenna is loop-shaped with one winding,
wherein a width of the first antenna is smaller than a width of a part of the second antenna, and
wherein an inner edge and an outer edge of the first antenna overlap with the second antenna.

21. The semiconductor device according to claim 2, wherein a thin film transistor is used in the integrated circuit.

22. The semiconductor device according to claim 2,
wherein the fiber body includes a warp yarn and a weft yarn in each of which a plurality of single yarns of an organic compound or an inorganic compound are bundled, and
wherein directions of the warp yarn and the weft yarn are different in the pair of structure bodies.

23. The semiconductor device according to claim 2, wherein one of a polyvinyl alcohol fiber, a polyester fiber, a polyamide fiber, a polyethylene fiber, an aramid fiber, a polyparaphenylene benzobisoxazole fiber, a glass fiber, and a carbon fiber is used for the fiber body.

24. The semiconductor device according to claim 2, wherein the resin includes one of a thermosetting resin or a thermoplastic resin.

25. The semiconductor device according to claim 24, wherein the thermosetting resin is one of an epoxy resin, an unsaturated polyester resin, a polyimide resin, a bismaleimide-triazine resin, and a cyanate resin.

26. The semiconductor device according to claim 24, wherein the thermoplastic resin is one of a polyphenylene oxide resin, a polyetherimide resin, and a fluorine resin.

27. A method of manufacturing a semiconductor device, comprising the steps of:
interposing an integrated circuit and a first antenna connected to the integrated circuit between a pair of structure bodies,
wherein at least one first antistatic film is formed on at least one surface of one of the pair of structure bodies, and
wherein at least one second antistatic film is formed on at least one surface of the other of the pair of structure bodies; and
attaching a second antenna to one of the pair of structure bodies so that the one of the pair of structure bodies is interposed between the first antenna and the second antenna,
wherein each of the pair of structure bodies is formed by impregnating a fiber body with a resin.

28. The method according to claim 27,
wherein the one surface of the one of the pair of structure bodies is not facing the integrated circuit and the first antenna, and
wherein the one surface of the other of the pair of structure bodies is not facing the integrated circuit and the first antenna.

29. The method according to claim 27,
wherein the one surface of the one of the pair of structure bodies is facing the integrated circuit and the first antenna, and
wherein the one surface of the other of the pair of structure bodies is facing the integrated circuit and the first antenna.

30. The method according to claim 27,
wherein the first antistatic film is formed on opposite sides of the one of the pair of structure bodies, and
wherein the second antistatic film is formed on opposite sides of the other of the pair of structure bodies.

31. The method according to claim 27,
wherein the pair of structure bodies have an insulating property.

32. The method according to claim 27,
wherein the antistatic film is one of a surfactant, a conductive polymer, a resin in which conductive particles are dispersed, and a siloxane-based resin.

33. The method according to claim 27,
wherein the antistatic film has a surface resistance value of $10^6$ to $10^{14}$ $\Omega/cm^2$.

* * * * *